(12) United States Patent
Wakimoto et al.

(10) Patent No.: US 8,604,584 B2
(45) Date of Patent: Dec. 10, 2013

(54) SEMICONDUCTOR DEVICE AND METHOD OF MANUFACTURING SEMICONDUCTOR DEVICE

(75) Inventors: Hiroki Wakimoto, Matsumoto (JP); Kenichi Iguchi, Matsumoto (JP); Koh Yoshikawa, Matsumoto (JP); Tsunehiro Nakajima, Matsumoto (JP); Shunsuke Tanaka, Matsumoto (JP); Masaaki Ogino, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 148 days.

(21) Appl. No.: 13/038,349

(22) Filed: Mar. 1, 2011

(65) Prior Publication Data

US 2011/0215435 A1    Sep. 8, 2011

(30) Foreign Application Priority Data

Mar. 2, 2010    (JP) .................. 2010-045740

(51) Int. Cl.
*H01L 21/78*        (2006.01)
*H01L 21/302*        (2006.01)

(52) U.S. Cl.
USPC ............ 257/504; 257/E21.599; 257/E21.214; 257/147; 257/139; 257/199; 438/463; 438/433; 438/138; 438/535; 438/234

(58) Field of Classification Search
USPC .......... 257/504, E21.599, E21.214, E29.006, 257/147, 139, 199, 341; 438/463, 433, 138, 438/535, 234
See application file for complete search history.

(56) References Cited

U.S. PATENT DOCUMENTS

| 2005/0029568 A1 | 2/2005 | Tokuda et al. |
| 2006/0038206 A1 | 2/2006 | Shimoyama et al. |
| 2011/0042715 A1* | 2/2011 | Tsukuda et al. ............. 257/139 |

FOREIGN PATENT DOCUMENTS

| JP | 62-229843 A | 10/1987 |
| JP | 2005-093972 A | 4/2005 |
| JP | 2006-303410 A | 11/2006 |
| JP | 2007-109783 A | 4/2007 |

* cited by examiner

*Primary Examiner* — Cathy N Lam
(74) *Attorney, Agent, or Firm* — Rabin & Berdo, P.C.

(57) ABSTRACT

Some embodiments of the present invention relate to a semiconductor device and a method of manufacturing a semiconductor device capable of preventing the deterioration of electrical characteristics. A p-type collector region is provided on a surface layer of a backside surface of an n-type drift region. A $p^+$-type isolation layer for obtaining reverse blocking capability is provided at the end of an element. In addition, a concave portion is provided so as to extend from the backside surface of the n-type drift region to the $p^+$-type isolation layer. A p-type region is provided and is electrically connected to the $p^+$-type isolation layer. The $p^+$-type isolation layer is provided so as to include a cleavage plane having the boundary between the bottom and the side wall of the concave portion as one side.

6 Claims, 24 Drawing Sheets

SEMICONDUCTOR DEVICE AND METHOD OF MANUFACTURING SEMICONDUCTOR DEVICE

CROSS-REFERENCE TO RELATED APPLICATION

This application claims priority under 35 U.S.C. §119 from Japanese Patent Application No. 2010-045740, filed on Mar. 2, 2010, the entirety of which is incorporated herein by reference.

BACKGROUND OF THE INVENTION

1. Field of the Invention

The present invention relates to a semiconductor device and a method of manufacturing a semiconductor device.

2. Description of the Related Art

An insulated gate bipolar transistor (IGBT) is one type of power semiconductor devices. The IGBT is a power semiconductor element having the high-speed switching characteristics and voltage driving characteristics of a metal oxide semiconductor field effect transistor (MOSFET), and the low on-voltage characteristics of a bipolar transistor. The IGBT has been expanding the application fields thereof from the industrial field (e.g., a general-purpose inverter, an AC servo, an uninterruptible power source (UPS), a switching power supply, etc.) to the home appliance field (e.g., an electronic oven, a rice cooker, a stroboscope, etc.).

A power conversion apparatus using semiconductor elements has been studied in which a bidirectional switching element is applied to a direct conversion circuit such as a matrix converter, in order to perform AC (alternating current)/AC conversion, thereby reducing the size, weight, and cost of a circuit and improving the efficiency and response speed of the circuit. The bidirectional switching element is formed by connecting an IGBT and an anti-parallel diode (hereinafter, referred to as reverse blocking IGBTs) having capability (hereinafter, referred to as reverse blocking capability) to a reverse voltage in parallel. Therefore, there is a demand for the development of the reverse blocking IGBT.

SUMMARY OF THE INVENTION

An object of the invention is to provide a semiconductor device and a method of manufacturing a semiconductor device capable of preventing the deterioration of electrical characteristics.

In order to solve the above-mentioned problems and achieve the object, according to a first aspect of the invention, a semiconductor device has the following characteristics. The semiconductor device includes a front surface element structure that is provided on a first main surface of a substrate of a first conduction type, a first semiconductor region of a second conduction type that is provided at the end of an element on the first main surface of the substrate, a concave portion that extends from a second main surface of the substrate to the first semiconductor region, and a second semiconductor region of the second conduction type that is provided on the second main surface of the substrate and is electrically connected to the first semiconductor region. In this case, the first semiconductor region includes at least a cleavage plane having a boundary between the bottom and side wall of the concave portion as one side.

According to a second aspect of the invention, in the semiconductor device according to the first aspect, the first semiconductor region may be adjacent to a third semiconductor region of the first conduction type, which is the substrate. In addition, the amount of impurities included in a portion of the first semiconductor region from the cleavage plane to the front surface element structure may be set such that a depletion layer extending from the third semiconductor region into the first semiconductor region does not reach the cleavage plane.

According to a third aspect of the invention, in the semiconductor device according to the first aspect, the total amount of impurities may be equal to or more than $1.2 \times 10^{12}/\text{cm}^2$.

According to a fourth aspect of the invention, a method of manufacturing a semiconductor device has the following characteristics. The method includes forming a first semiconductor region of a second conduction type on a first main surface of a wafer of a first conduction type, forming a front surface element structure on the first main surface of the wafer, forming a concave portion extending from the second main surface of the wafer to the first semiconductor region, forming a second semiconductor region of a second conduction type on the second main surface of the wafer so as to be electrically connected to the first semiconductor region, and removing a portion of the first semiconductor region and cutting the wafer into chips. In the removing, the first semiconductor region is removed such that a cut plane of the first semiconductor region is inclined with respect to the first main surface of the wafer.

According to a fifth aspect of the invention, in the method of manufacturing a semiconductor device according to the fourth aspect, in the removing, the first semiconductor region may be formed so as to include at least a cleavage plane having the boundary between the bottom and side wall of the concave portion as one side.

According to a sixth aspect of the invention, in the method of manufacturing a semiconductor device according to the fourth or fifth aspect, in the removing, the wafer may be cut by moving down a blade to the first main surface of the first semiconductor region and stopping the moving-down of the blade when the edge of the blade at least protrudes downward from the concave portion.

According to a seventh aspect of the invention, in the method of manufacturing a semiconductor device according to the fourth or fifth aspect, in the removing, the wafer may be cut by emitting a first laser beam to the surface of the first semiconductor region such that, as a depth from the surface of the first semiconductor region increases, the diameter of the first laser beam is gradually reduced.

According to an eighth aspect of the invention, in the method of manufacturing a semiconductor device according to the seventh aspect, in the removing, the diameter of the first laser beam may be gradually reduced along the cut plane to be exposed from the surface of the first semiconductor region.

According to a ninth aspect of the invention, in the method of manufacturing a semiconductor device according to the fourth or fifth aspect, in the removing, the wafer may be cut by emitting a second laser beam to a depth along the cut plane to be exposed in the first semiconductor region to modify the irradiated portion and applying external force to the wafer to cut the first semiconductor region along the modified portion.

According to a tenth aspect of the invention, in the method of manufacturing a semiconductor device according to the ninth aspect, in the removing, the emission depth of the second laser beam may gradually increase from the end of the removed portion of the first semiconductor region to the center of the removed portion.

According to an eleventh aspect of the invention, a method of manufacturing a semiconductor device has the following characteristics. The method includes patterning a resist applied onto the surface of a wafer to form a mask in which a region in which a concave portion of the wafer will be formed is opened, and performing etching with an alkali etchant using the mask to form the concave portion in the wafer. A corner of the mask includes a protruding portion that protrudes onto the region in which the concave portion will be formed.

According to a twelfth aspect of the invention, in the method of manufacturing a semiconductor device according to the eleventh aspect, the protruding portion may have a square shape having one side with a width $a_1$. When a depth of the concave portion is d, a width $a_2$, which is half of the width $a_1$, may satisfy $a_2=0.60d$.

According to a thirteenth aspect of the invention, in the method of manufacturing a semiconductor device according to the eleventh aspect, the protruding portion may have a circular shape with a radius $a_3$. When a depth of the concave portion is d, the radius $a_3$ may satisfy $a_3=0.81d$.

According to a fourteenth aspect of the invention, in the method of manufacturing a semiconductor device according to any one of the eleventh to thirteenth aspects, the alkali etchant may include tetramethylammonium hydroxide, ammonium disulfate, and silicon.

According to the first to third aspects, the first semiconductor region is provided so as to include the cleavage plane having the boundary (stress concentration portion) between the bottom and side wall of the concave portion. The cleavage plane has a plane orientation in which a crack is likely to occur. Therefore, even when a crack occurs in the substrate with the stress concentration portion as a base point, it is possible to prevent the crack occurring in the cleavage plane from reaching the third semiconductor region. In this way, it is possible to prevent the generation of a leakage current due to a crack and maintain the reverse blocking capability of the reverse blocking IGBT.

According to the second and third aspects, the total amount of impurities in a portion of the first semiconductor region from the pn junction plane to the cleavage plane is set such that the depletion layer extending from the third semiconductor region into the first semiconductor region does not reach the cleavage plane. Therefore, even when a crack occurs in the cleavage plane, the depletion layer extending from the third semiconductor region into the first semiconductor region does not reach the cleavage plane when a reverse voltage is applied. In this way, it is possible to prevent a reduction in the reverse blocking capability of the reverse blocking IGBT.

According to the fourth to tenth aspects, the end of the chip is cut by dicing so as to be inclined at a predetermined angle with respect to the front surface of the wafer. Therefore, even when external stress is applied during mounting or operation, it is possible to prevent stress from being concentrated on the boundary between the bottom and side wall of the concave portion. In this way, it is possible to reduce the possibility that a crack will reach the third semiconductor region through the interface (pn junction plane) between the first semiconductor region and the third semiconductor region. In addition, it is possible to prevent the entire canopy portion from being broken into a silicon piece. Therefore, it is possible to reduce the possibility that the canopy portion, which is a silicon piece, will be inserted between the chip and the mounting substrate and stress will be applied to the chip with the silicon piece as a base point.

According to the eleventh to fourteenth aspects, the protruding portion that protrudes onto the region in which the concave portion is formed is provided at the corner of the mask used to form the concave portion. When the end of the corner of the concave portion that is most likely to be etched is masked with the protruding portion, it is possible to make the amount of etching of the end of the corner of the concave portion substantially equal to the amount of etching of the side wall of the corner of the concave portion. In this way, it is possible to prevent, for example, a pit (undercut) from being formed at the end of the corner of the concave portion. The mask is formed by a resist. Therefore, it is possible to easily perform side etching below the mask, as compared to etching using the oxide film mask according to the related art. In this way, even when an undercut occurs at the corner of the concave portion, side etching is performed above the undercut and thus it is possible to prevent an uneven portion from being formed on the side wall of the concave portion. Therefore, for example, it is possible to effectively form a p-type region on the side wall of the concave portion of the reverse blocking IGBT and electrically connect the first semiconductor region and the second semiconductor region. In this way, it is possible to maintain the reverse blocking capability of the reverse blocking IGBT.

According to the semiconductor device and the method of manufacturing a semiconductor device of the above-mentioned aspects of the invention, it is possible to prevent the deterioration of electrical characteristics.

DETAILED DESCRIPTION OF THE EXEMPLARY EMBODIMENTS

Figure 25:
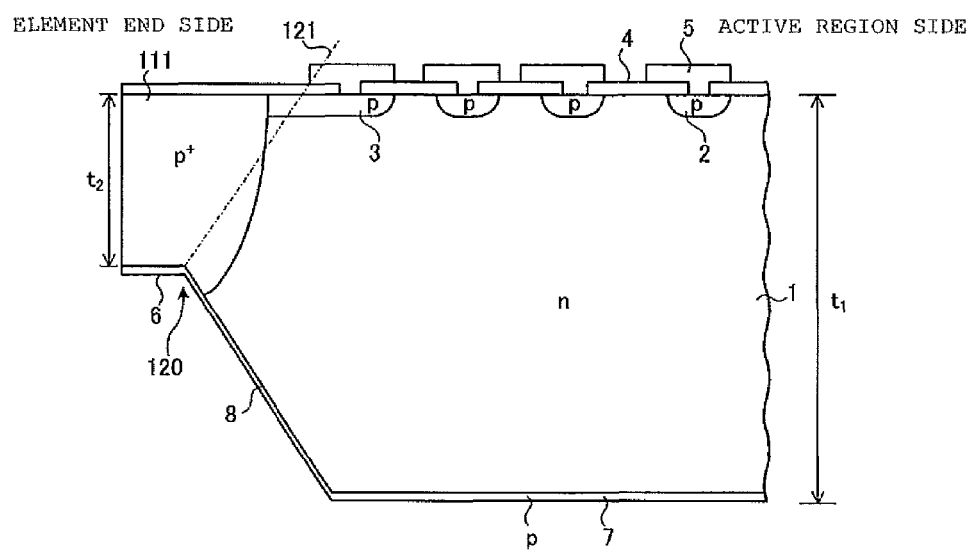
FIG. 25 is a cross-sectional view illustrating a reverse voltage blocking structure of the reverse blocking IGBT according to the related art.

FIG. 25 is a cross-sectional view illustrating the reverse voltage blocking structure of the reverse blocking IGBT according to the related art. As shown in FIG. 25, the reverse voltage blocking structure of the reverse blocking IGBT is provided on a substrate, which will be an n-type drift region 1, and surrounds an active region (not shown). In the reverse blocking voltage structure, a plurality of field limiting rings (hereinafter, referred to as FLRs) 2, which is a floating p-type region, is provided on a surface layer of the front-side surface of the n-type drift region 1. In addition, a p-type channel stopper 3 is provided at the end of the element so as to be separated from the FLRs 2.

A portion of the front surface of the n-type drift region 1 in which the FLRs 2 and the channel stopper 3 are not formed is covered with an interlayer insulating film 4. A field plate (hereinafter, referred to as an FP) 5, which is a floating conductive film, is provided on the interlayer insulating film 4. The FP 5 comes into contact with the FLRs 2 and the channel stopper 3. A p-type collector region 7 is provided on a surface layer of the backside surface of the n-type drift region 1.

A $p^+$-type region (hereinafter, referred to as a $p^+$-type isolation layer) 111 for obtaining reverse blocking capability is provided at the end of the element. The $p^+$-type isolation layer 111 comes into contact with the channel stopper 3. A concave portion 6 is provided so as to extend from the backside surface of the n-type drift region 1 to the $p^+$-type isolation layer 111. A p-type region 8 is provided on a surface layer of a side wall and a bottom of the concave portion 6. The $p^+$-type isolation layer 111 is connected to the p-type collector region 7 through the p-type region 8.

The reverse blocking IGBT may also have a structure in which the concave portion 6 is not provided in the backside surface and the $p^+$-type isolation layer 111 is provided with a depth equal to the thickness $t_1$ of the n-type drift region 1 so as to reach the p-type collector region 7. In this case, impurities introduced into the front surface of the n-type drift region 1 are diffused so as to reach the backside surface of the n-type drift region 1, thereby forming the $p^+$-type isolation layer 111. In this case, the diffusion depth of the $p^+$-type isolation layer 111 needs to be equal to or more than 120 μm at a reverse blocking voltage of 600 V and equal to or more than 200 μm at a reverse blocking voltage of 1200 V. When the diffusion depth of the $p^+$-type isolation layer 111 is equal to or more than 120 μm, a high temperature diffusion needs to be performed at 1300° C. for 100 hours or more, which results in a reduction in the throughput of the reverse blocking IGBT. Therefore, when the concave portion 6 is provided as shown in FIG. 25, it is possible to reduce the diffusion depth of the $p^+$-type isolation layer 111 and thus reduce a high temperature diffusion load for forming the $p^+$-type isolation layer 111.

Another reverse blocking IGBT has been proposed in which a semiconductor substrate 1 having a p-type collector layer formed on a backside surface thereof is provided, a trench extending from a front side surface to the collector layer is formed at the edge of the substrate so as to surround the inside of the edge, and a p-type isolation region formed by the diffusion of impurities into the side wall is connected to the collector layer (for example, see Japanese Patent Application Laid-Open (JP-A) No. 2005-093972).

Figure 26:
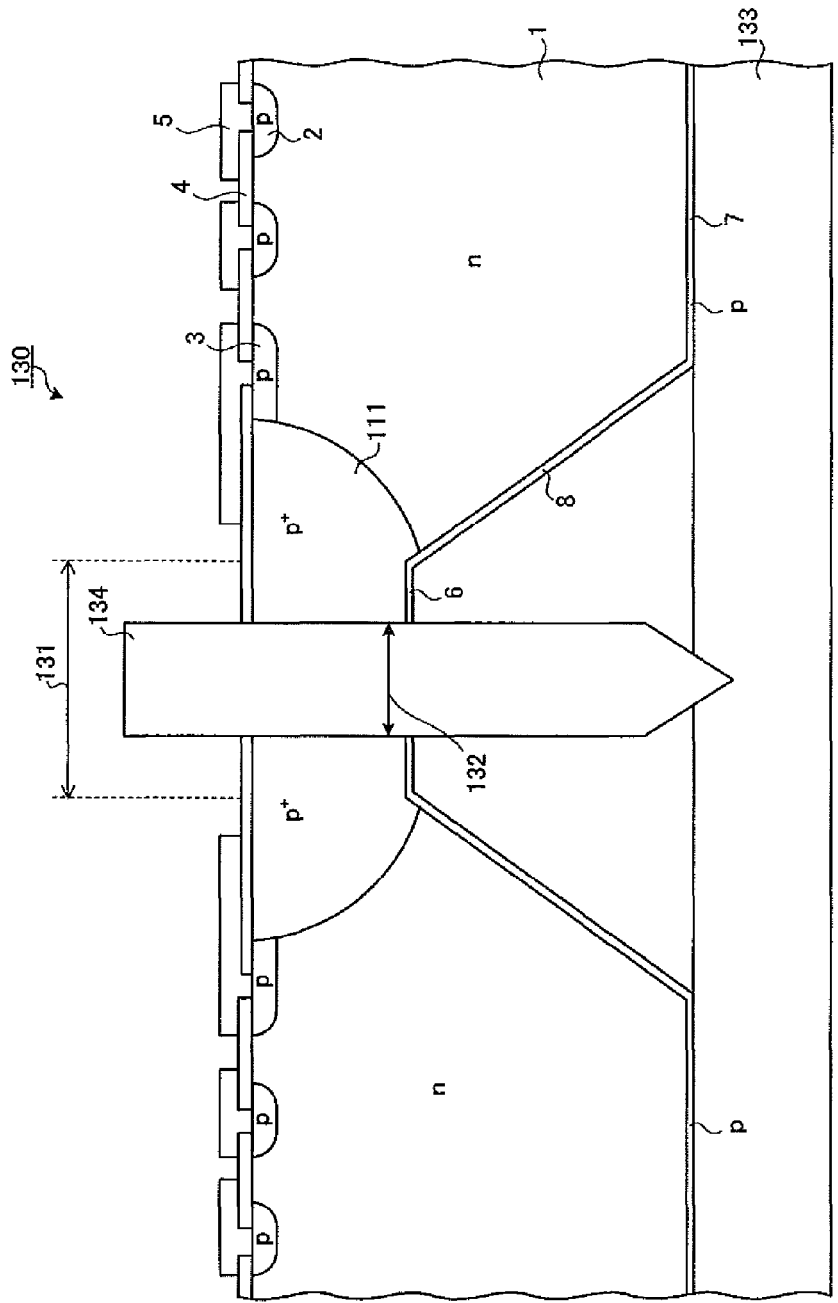
FIG. 26 is a cross-sectional view illustrating a main portion of dicing according to the related art.

FIG. 26 is a cross-sectional view illustrating a main portion of dicing according to the related art. FIG. 26 shows a portion of a dicing line 131 of a wafer 130. As shown in FIG. 26, in the wafer 130, reverse blocking IGBTs (see FIG. 25) are provided in regions which will be chips after dicing. The dicing line 131 is provided between the reverse blocking IGBTs of the wafer 130. For example, the dicing line 131 is provided on the $p^+$-type isolation layer 111 provided at the end of the reverse blocking IGBT and the concave portion 6. The dicing line 131 of the wafer 130 includes a portion (hereinafter, referred to as a cutting allowance) 132 to be removed by dicing.

A dicing tape 133 is adhered to the backside surface of the wafer 130 on which, for example, the p-type collector region 7 is formed, and the entire wafer 130 is adhered to, for example, a ring frame for dicing. Then, the wafer 130 is placed on, for example, a flat table, and a dicing blade 134 is moved down to the front surface of the wafer 130 to remove the cutting allowance 132 of the wafer 130, thereby cutting the wafer 130 into individual chips.

For example, a thin circular rotary blade having diamond fine particles adhered thereto is used as the dicing blade 134. The dicing blade 134 has a cross-sectional shape, which has a side surface that is parallel to the rotation axis of the dicing blade 134 and is vertical to the front-side surface of the wafer 130 and in which only an outer circumferential portion, which is a blade edge, is acute, as shown in FIG. 26. During dicing, the dicing blade 134 is moved down until the blade edge reaches the surface of the dicing tape 133. Therefore, the cut plane of the wafer 130 is vertical to the front-side surface of the wafer 130.

As a method of dicing the wafer, the following method has been proposed. The front-side surface of a thin semiconductor wafer having a surface structure forming a semiconductor chip is adhered to a supporting substrate by a double-sided adhesive tape, and a trench, which will be a scribe line, is formed in the backside surface of the thin semiconductor wafer by anisotropic wet etching such that a crystal plane is exposed. Then, a isolation layer for maintaining reverse blocking voltage is formed on the side surface of the trench through which the crystal plane is exposed by ion implantation and low-temperature annealing or laser annealing at the same time as a p-type collector region, which is a rear diffusion layer, is formed. The double-sided adhesive tape peels off from the collector electrode to form a semiconductor chip. In this way, a reverse blocking semiconductor device is formed (for example, see JP-A No. 2006-303410).

Figure 27:
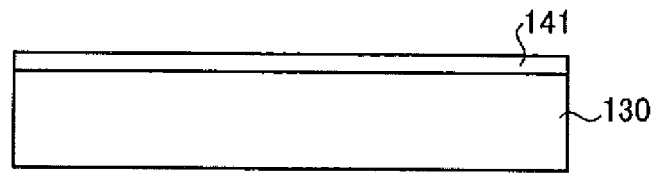
FIG. 27 is a cross-sectional view illustrating a method of forming a mask used to form a concave portion according to the related art.
Figure 28:
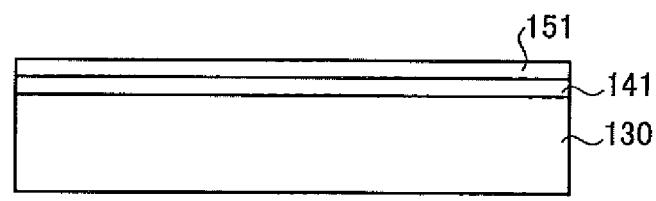
FIG. 28 is a cross-sectional view illustrating the method of forming the mask used to form the concave portion according to the related art.
Figure 29:
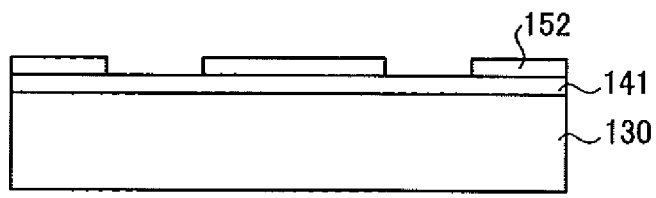
FIG. 29 is a cross-sectional view illustrating the method of forming the mask used to form the concave portion according to the related art.
Figure 30:
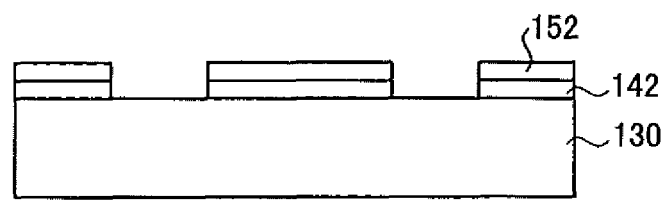
FIG. 30 is a cross-sectional view illustrating the method of forming the mask used to form the concave portion according to the related art.
Figure 31:
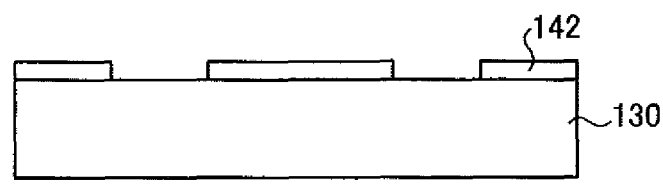
FIG. 31 is a cross-sectional view illustrating the method of forming the mask used to form the concave portion according to the related art.

FIGS. 27 to 31 are cross-sectional views illustrating a method of forming a mask used to form a concave portion according to the related art. For example, the mask for forming a concave portion is used to form the concave portion (see FIG. 25) of the reverse blocking IGBT according to the related art in the wafer 130 (see FIG. 26). In FIGS. 27 to 31, the front-side surface MOS structure of the reverse blocking IGBT is not shown. The wafer 130 in which a concave portion will be formed is shown with the backside surface facing upward (which is similar to FIGS. 8 and 9). First, as shown in FIG. 27, an oxide film 141 is formed on the backside surface of the wafer 130. Then, as shown in FIGS. 28 and 29, a photo-resist 151 applied onto the surface of the oxide film 141 is patterned by photolithography such that the oxide film 141 formed on a concave portion forming region is exposed. In this way, as shown in FIG. 29, a resist mask 152 for patterning the oxide film 141 is formed on the surface of the oxide film 141. Then, as shown in FIG. 30, a portion of the oxide film 141 exposed through opening portions of the resist mask 152 is removed using the resist mask 152, and the concave portion forming region of the wafer 130 is exposed. In this way, only an oxide film mask 142 below the resist mask 152 remains. Then, as shown in FIG. 31, the resist mask 152 is removed and the oxide film mask 142 used to form a concave portion is completed.

As another method of forming a mask used to form a concave portion, the following method has been proposed. When a groove is formed in the surface of a semiconductor monocrystalline layer by anisotropic etching, a protrusion that is inclined with respect to a direction in which the groove is formed is provided at the corner of an etching mask pattern and the internal angle of the corner of the pattern is less than 90°. A thermally-oxidized film $SiO_2$ is used as a mask for anisotropic etching (for example, see JP-A No. 62-229843).

However, as a result of the inventors' study, the following problems occurred. As shown in FIG. 25, when the concave portion 6 is provided in the reverse blocking IGBT, a portion (hereinafter, referred to as a canopy portion) close to the end of the element is thicker than another portion of the substrate close to the active region. The base of the canopy portion, that is, the boundary between the bottom and side wall of the concave portion 6 becomes a portion (hereinafter, referred to as a stress concentration portion) 120 on which stress is likely to be concentrated.

In the chip having the above-mentioned reverse blocking IGBT formed therein, when stress, such as a high and low temperature cycles, is applied after mounting, there is a concern that a crack will occur in the vicinity of the canopy portion with the stress concentration portion 120 as the starting point. When a wafer having the reverse blocking IGBT formed therein is diced, bending stress caused by dicing (see FIG. 26) is applied to the canopy portion and stress is concentrated on the stress concentration portion 120. In this case, there is a concern that a crack will occur in the vicinity of the canopy portion with the stress concentration portion 120 as the starting point.

Figure 24:
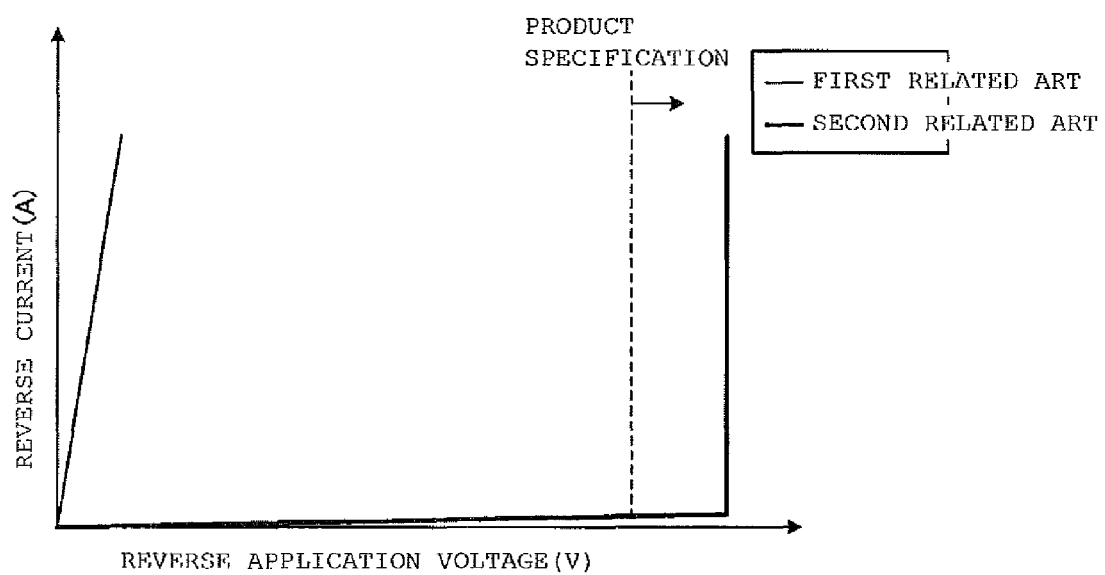
FIG. 24 is a characteristic diagram illustrating the relationship between a reverse voltage and a reverse current of a reverse blocking IGBT according to the related art.

FIG. 24 is a characteristic diagram illustrating the relationship between a reverse application voltage and a reverse current of the reverse blocking IGBT. The reverse current of the reverse blocking IGBT was measured when a crack occurred in a plane 121 (see FIG. 25) extending from the $p^+$-type isolation layer 111 to the n-type drift region 1 (hereinafter, referred to as a first related art) and when no crack occurred (hereinafter, referred to as a second related art). As shown in FIG. 24, in the second related art, the reverse current was small until the reverse application voltage exceeds the product specification and increases due to avalanche breakdown when the reverse voltage equal to or more than the product specification was applied. In the first related art, the reverse current increased in proportion to an increase in the reverse voltage applied at the same time as the reverse voltage was applied. As such, when a crack occurs in the plane 121 extending from the $p^+$-type isolation layer 111 to the n-type drift region 1, it is difficult for the reverse blocking IGBT to maintain reverse blocking capability and the electrical characteristics of the reverse blocking IGBT deteriorate.

In addition, there is a concern that the canopy portion will be broken due to a crack occurring in the canopy portion by dicing. When the canopy portion, which is a silicon piece, is inserted between a chip and a mounting substrate during the mounting of the chip, stress is applied to the chip with the silicon piece as the starting point. The stress occurring in the chip is converted into electric energy (piezo effect) and a reverse leakage current is likely to be generated in the reverse blocking IGBT formed on the chip. As a result, the reverse voltage blocking capability of the reverse blocking IGBT may deteriorate. The silicon piece causes a void to be formed in a solder layer between the chip and the mounting substrate during the mounting of the chip. The void formed in the solder layer causes a soldering defect. As a result, a reliability of the reverse blocking IGBT may deteriorate.

Hereinafter, a semiconductor device and a method of manufacturing the semiconductor device according to exemplary embodiments of the invention will be described in detail with reference to the accompanying drawings. In the specification and drawings, electrons or holes in an n-type or p-type layer or region mean carriers. In addition, symbols "+" and "−" added to n or p mean that impurity concentration is higher and lower than that of a layer or a region to which the symbols are not added. In the following embodiments and drawings, the same components are denoted by the same reference numerals and a description thereof will not be repeated.

Figure 1:
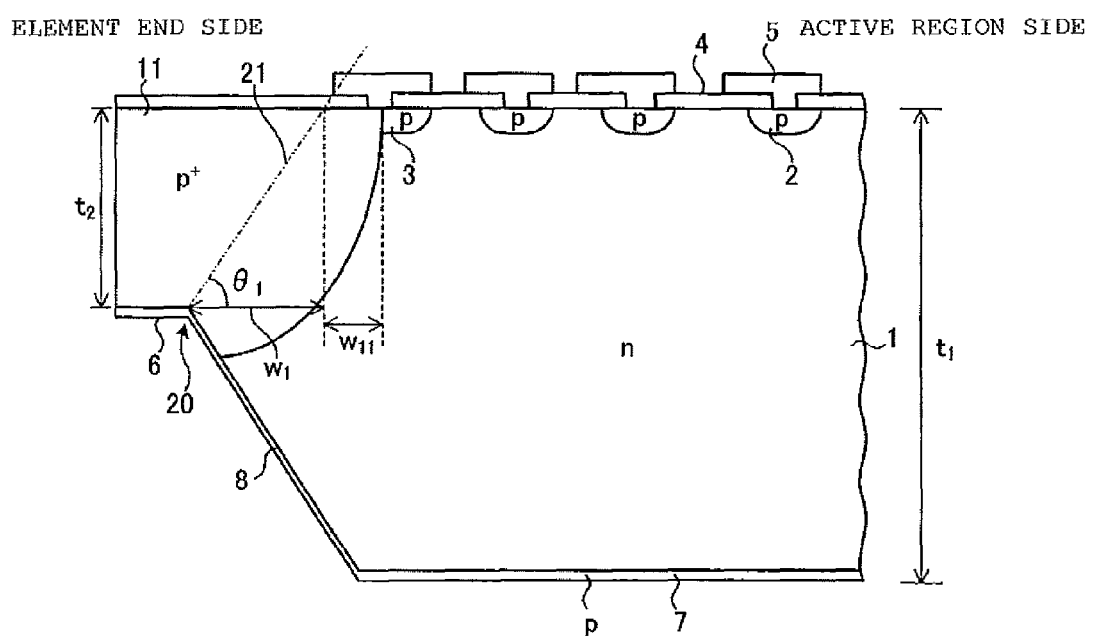
FIG. 1 is a cross-sectional view illustrating a reverse voltage blocking structure of a reverse blocking IGBT according to a first embodiment.

FIG. 1 is a cross-sectional view illustrating a reverse voltage blocking structure of a reverse blocking IGBT according to a first embodiment. As shown in FIG. 1, the reverse voltage blocking structure of the reverse blocking IGBT is provided on the front surface (first main surface) of an n-type substrate, which will be an n-type drift region 1 (third semiconductor region), and surrounds an active region (not shown). The plane orientation of the front surface of the substrate may be the {100} plane. In the reverse voltage blocking structure, a plurality of field limiting rings (FLR) 2, which is a floating p-type region, is provided on a surface layer on the front surface of the n-type drift region 1. A p-type channel stopper 3 is provided at the end of the element so as to be separated from the FLRs 2.

The FLRs 2 and the channel stopper 3 surround the active region (not shown) of the reverse blocking IGBT. A MOS (Metal Oxide Semiconductor) gate structure (not shown) including, for example, an $n^+$-type emitter region, a $p^+$-type base region, an emitter electrode, and a gate electrode is provided in the active region. The MOS gate structure or the reverse voltage blocking structure corresponds to a front surface element structure.

A portion of the front surface of the n-type drift region 1 in which the FLRs 2 and the channel stopper 3 are not provided is covered with an interlayer insulating film 4. A field plate (FP) 5 in a floating conductive film is provided on the interlayer insulating film 4. The FP 5 comes into contact with the FLRs 2 and the channel stopper 3. A p-type collector region 7 (second semiconductor region) is provided in a surface layer of the backside surface (second main surface) of the n-type drift region 1.

A $p^+$-type isolation layer (first semiconductor region) 11 for obtaining reverse blocking capability is provided at the end of the element. The $p^+$-type isolation layer 11 will be described in detail below. In addition, a concave portion 6 that extends from the backside surface of the n-type drift region 1 to the $p^+$-type isolation layer 11 is provided at the end of the element. In the concave portion 6, the width of an opening portion is smaller than that of the bottom. A p-type region 8 is provided on the surface layer of the bottom and side wall of the concave portion 6.

The concave portion 6 causes the thickness $t_2$ of a portion of the substrate close to the end of the element to be smaller than the thickness $t_1$ of a portion of the substrate close to the active region. That is, a portion (canopy portion) with a thickness smaller than the thickness t1 of a portion of the substrate close to the active region is formed close to the end of the element. The thickness $t_2$ of the portion of the substrate close to the end of the element may be equal to or more than 50 μm and equal to or less than 100 μm. The reason is as follows. In a non-punch-through (NPT) type reverse blocking IGBT, in order to obtain a reverse blocking voltage of 1200 V, it is necessary to reduce the thickness $t_1$ of the portion of the substrate close to the active region to, for example, about 200 μm. In this case, when the thickness $t_2$ of the portion of the substrate close to the end of the element is less than 50 μm, a wafer having the reverse blocking IGBT formed thereon is likely to be cracked during a manufacturing process. When the thickness $t_2$ of the portion of the substrate close to the end of the element is more than 100 μm, deep diffusion is needed in the $p^+$-type isolation layer 11, which results in a reduction in the throughput of the reverse blocking IGBT.

The $p^+$-type isolation layer 11 is electrically connected to the p-type collector region 7 through the p-type region 8. In addition, the $p^+$-type isolation layer 11 comes into contact with the channel stopper 3. The $p^+$-type isolation layer 11 is provided so as to include at least a cleavage plane 21 having the boundary 20 between the bottom and side wall of the concave portion 6 as one side. The bottom and side wall of the concave portion 6 are formed in a direction vertical to FIG. 1. Therefore, the boundary 20 between the bottom and side wall of the concave portion 6 is a straight line extending in the direction vertical to FIG. 1. The cleavage plane 21 has a specific plane orientation. In addition, the cleavage plane 21 is inclined to the active region at an angle $\theta_1$ with respect to the extension line of the bottom of the concave portion 6, using the boundary 20 between the bottom and side wall of the concave portion 6 as a base point. Therefore, an intersection portion between the cleavage plane 21 and the front surface of the substrate is disposed at a position that is closer to the active region than the boundary 20 between the bottom and side wall of the concave portion 6 by the width $w_1$ of the cleavage plane 21 in the direction parallel to the front surface of the substrate. The $p^+$-type isolation layer 11 is provided so as to include at least the intersection portion between the cleavage plane 21 and the front surface of the substrate.

The reason why the $p^+$-type isolation layer 11 is provided in this way is as follows. In the reverse blocking IGBT, when the canopy portion is provided at the end of the element, stress is likely to be concentrated on the boundary 20 between the bottom and side wall of the concave portion 6 (hereinafter, referred to as a stress concentration portion 20). A crack is likely to occur in a specific plane orientation with the stress concentration portion 20 as a base point. That is, the crack is likely to occur in a region between the stress concentration portion 20 and a position that is the width (hereinafter, referred to as a crack width) $w_1$ away from the stress concentration portion 20 to the active region. It is possible to predict the plane orientation in which a crack is likely to occur on the basis of the plane orientation of the substrate having the reverse blocking IGBT formed thereon. Therefore, the $p^+$-type isolation layer 11 is provided so as to include the cleavage plane 21 having the plane orientation in which a crack is likely to occur. In this case, even when a crack occurs in the substrate with the stress concentration portion 20 as a base point, it is possible to limit the position of the crack in the $p^+$-type isolation layer 11. In this way, even when a crack occurs with the stress concentration portion 20 as a base point, it is possible to prevent the crack from reaching the n-type drift region 1. The crack width $w_1$ is represented by the following Expression 1.

$$w_1 = t_2/\tan \theta_1 \qquad \text{[Expression 1]}$$

For example, when the front surface element structure of the IGBT is formed on the {100} plane of the silicon substrate, a crack is likely to occur in, for example, the {111} plane with the stress concentration portion 20 as a base point. Therefore, the plane orientation of the cleavage plane 21 may be the {111} plane. In this case, the angle $\theta_1$ formed between the cleavage plane 21 and the extension line of the bottom of the concave portion 6 is 54.7° ($\tan \theta_1 = \sqrt{2}$). In the IGBT in which the thickness $t_1$ of a portion of the substrate close to the active region is 200 μm, for example, when the thickness $t_2$ of a portion of the substrate close to the end of the element is 80 μm, the crack width $w_1$ is 56.6 μm by Expression 1. Therefore, impurities may be diffused to a width of 56.6 μm or more from the stress concentration portion 20 to the active region to form the $p^+$-type isolation layer 11.

The $p^+$-type isolation layer 11 may be provided so as to have a design margin $w_{11}$ of 20 μm to 100 μm from an intersection portion between the cleavage plane 21 and the front surface of the substrate to the active region. In this case, the $p^+$-type isolation layer 11 is formed by diffusing impurities to a width, which is the sum of the crack width $w_1$ and the design margin $w_{11}$, from the stress concentration portion 20. It is preferable that the design margin $w_{11}$ be small. The reason is that, when the design margin $w_{11}$ is large, the region of the $p^+$-type isolation layer 11 is extended and an element operation region is reduced.

As described above, according to the first embodiment, the p+-type isolation layer 11 is provided so as to include the cleavage plane 21 having the boundary (stress concentration portion) 20 between the bottom and side wall of the concave portion 6 as one side. The cleavage plane 21 has a plane orientation in which a crack is likely to occur. Therefore, even when a crack occurs in the substrate with the stress concentration portion 20 as a base point, it is possible to prevent the crack occurring in the cleavage plane 21 from reaching the n-type drift region 1. In this way, it is possible to prevent increasing a leakage current caused by a crack and maintain the reverse blocking capability of the reverse blocking IGBT. Therefore, it is possible to prevent the electrical characteristics of the reverse blocking IGBT from deteriorating.

Figure 2:
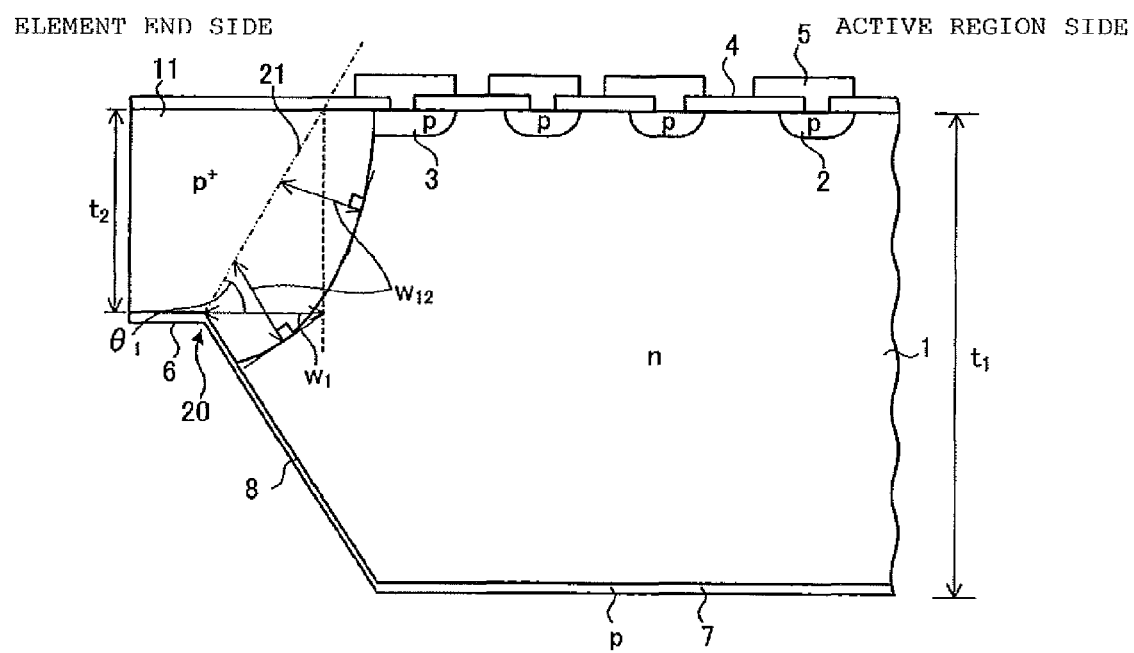
FIG. 2 is a cross-sectional view illustrating a reverse voltage blocking structure of a reverse blocking IGBT according to a second embodiment.

FIG. 2 is a cross-sectional view illustrating a reverse voltage blocking structure of a reverse blocking IGBT according to a second embodiment. In the first embodiment, the amount of impurities in a portion of the p+-type isolation layer 11 from the cleavage plane 21 to the active region (front-side surface element structure) may be set such that a depletion layer extending from the n-type drift region 1 into the p+-type isolation layer 11 does not reach the cleavage plane 21. The p+-type isolation layer 11 may be provided such that a pn junction plane is substantially parallel to the cleavage plane 21.

In the second embodiment, the amount of impurities in a portion of the p+-type isolation layer 11 from the interface (hereinafter, referred to as a pn junction plane) between the p+-type isolation layer 11 and the n-type drift region 1 to the cleavage plane 21 is set such that the depletion layer extending from the n-type drift region 1 into the p+-type isolation layer 11 does not reach the cleavage plane 21. The total amount of impurities may be, for example, $1.2 \times 10^{12}/cm^2$ or more. The reason is as follows.

When a reverse voltage is applied to the reverse blocking IGBT, the depletion layer extending from the n-type drift region 1 into the p+-type isolation layer 11 is spread into the p+-type isolation layer 11 in a direction that is substantially vertical to the pn junction plane. In this case, the maximum possible amount of impurities injected into the depletion layer from the pn junction plane is $1.2 \times 10^{12}/cm^2$. This is because the total amount of impurities required for the change of electric field intensity in the vicinity of the pn junction plane from critical electric field intensity to zero is about $1.2 \times 10^{12}/cm^2$.

The width (design margin) $w_{12}$ from the pn junction plane to the cleavage plane 21 is determined by the amount of impurities in a portion of the p+-type isolation layer 11 from the cleavage plane 21 to the active region. Therefore, when the p+-type isolation layer 11 is formed, impurities may be diffused into the p+-type isolation layer 11 until the total amount of impurities in a portion of the p+-type isolation layer 11 from the pn junction plane to the cleavage plane 21 is the design margin $w_{12}$ satisfying the above-mentioned conditions. Alternatively, the design margin $w_{12}$ may be predetermined and the total amount of impurities in a portion of the p+-type isolation layer 11 from the pn junction plane to the cleavage plane 21 may be adjusted. The structures other than the above are the same as those of the first embodiment.

As described above, according to the second embodiment, it is possible to obtain the same effect as that of the first embodiment. The p+-type isolation layer 11 is provided such that the total amount of impurities in a portion of the p+-type isolation layer 11 from the pn junction plane to the cleavage plane 21 satisfies the above-mentioned conditions. Therefore, even when a crack occurs in the cleavage plane 21, the depletion layer extending from the n-type drift region 1 into the p+-type isolation layer 11 does not reach the crack when a reverse voltage is applied. In this way, it is possible to prevent a reduction in the reverse blocking capability of the reverse blocking IGBT. Therefore, it is possible to prevent the electrical characteristics of the reverse blocking IGBT from deteriorating.

Figure 3:
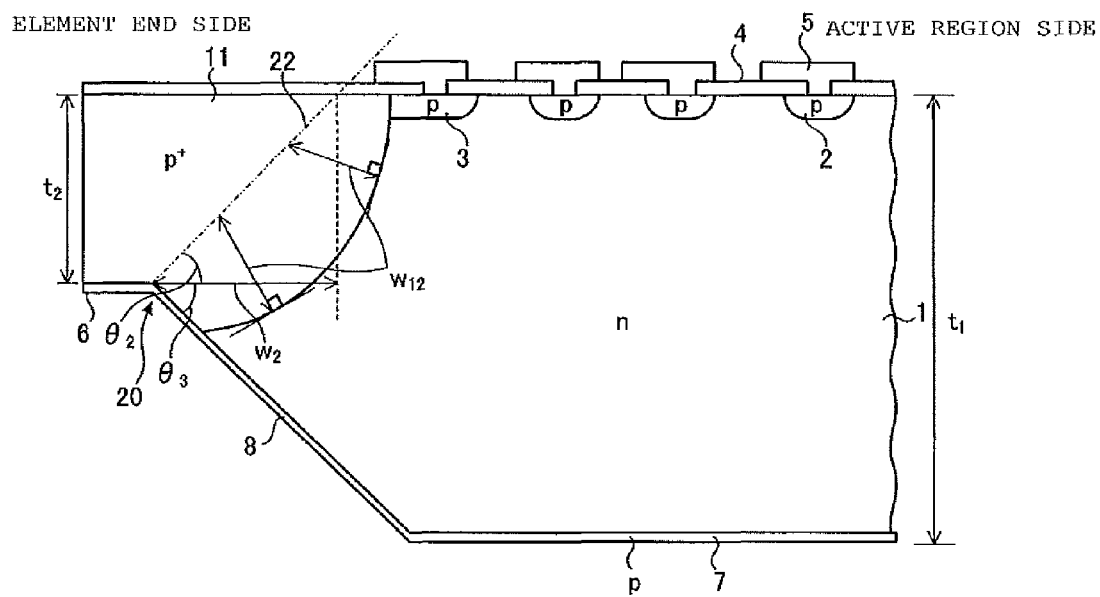
FIG. 3 is a cross-sectional view illustrating a reverse voltage blocking structure of a reverse blocking IGBT according to a third embodiment.

FIG. 3 is a cross-sectional view illustrating a reverse voltage blocking structure of a reverse blocking IGBT according to a third embodiment. In the first embodiment or the second embodiment, the p+-type isolation layer 11 may be provided so as to include a surface that is likely to appear by anisotropic wet etching.

In the third embodiment, the p+-type isolation layer 11 is provided so as to include a cleavage plane 22. The cleavage plane 22 has the same plane orientation as that of the surface formed by anisotropic wet etching. For example, the cleavage plane 22 has substantially the same plane orientation as the side wall of a concave portion 6 formed by anisotropic wet etching. That is, the angle $\theta_2$ formed between the cleavage plane 22 and the extension line of the bottom of the concave portion 6 is substantially equal to the angle $\theta_3$ formed between the side wall of the concave portion 6 and the extension line of the bottom of the concave portion 6. The cleavage plane 22 may be a plane having the boundary 20 between the bottom and side wall of the concave portion 6 as one side.

For example, when a tetra methyl ammonium hydroxide (TMAH) solution is used as an anisotropic wet etchant, the cleavage plane 22 may be the {111} plane that appears on a silicon surface. In this case, the angle $\theta_2$ formed between the cleavage plane 22 and the extension line of the bottom of the concave portion 6 is 54.7°.

Figure 4:
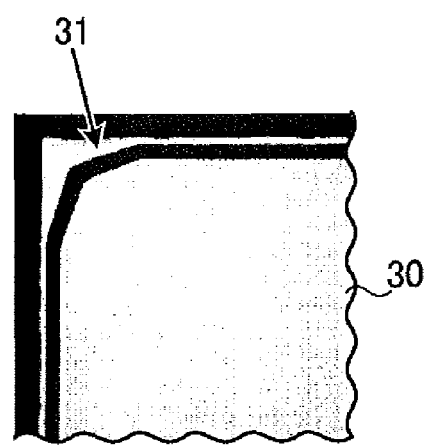
FIG. 4 is a diagram illustrating the end of the reverse blocking IGBT according to the third embodiment observed by an electron microscope from the surface direction.

FIG. 4 shows an electron micrograph of the end of the reverse blocking IGBT according to the third embodiment observed from the backside surface direction. For example, when a TMAH solution is used as the anisotropic wet etchant, the cleavage plane 22 may be the {311} plane, which is a representative plane appearing on the silicon surface. As shown in FIG. 4, the {311} plane is likely to appear at the corner 31 of a region 30 in which a front surface element structure is formed. The plane orientation of the region 30 in which the front surface element structure is formed is, for example, the {100} plane. In this case, the angle $\theta_2$ formed between the cleavage plane 22 and the extension line of the bottom of the concave portion 6 is 43°.

When an etchant obtained by adding various kinds of additives to the anisotropic wet etchant is used, the cleavage plane 22 may be a plane that is likely to appear on the silicon surface. The additive mixed with the anisotropic wet etchant may be, for example, a nonionic surface-active agent, such as Chemical Name Tween20 (Polyoxyethylene Sorbintan Monolaurate). When the above-mentioned anisotropic wet etchant is used, for example, the {110} plane appears on the silicon surface. The angle $\theta_2$ formed between the cleavage plane 22 and the extension line of the bottom of the concave portion 6 is represented by the following Expression 2. It is assumed that the plane orientation of the cleavage plane 22 is the {xyz} plane. In addition, it is assumed that the plane orientation of the silicon substrate on which the front surface element structure of the IGBT is formed is the {uvw} plane. The {uvw} plane may be, for example, the {100} plane.

$$\cos\theta_2 = (x \times u + y \times v + z \times w)/\{(x^2+y^2+z^2)^{1/2} \times (u^2+v^2+w^2)\} \quad \text{[Expression 2]}$$

The reason why the p+-type isolation layer 11 is provided as described above is that the entire surface appearing by anisotropic wet etching is likely to be cleft with the stress concentration portion 20 as a base point and a crack is likely to occur with the stress concentration portion 20 as a base point. For example, when the plane orientation of the side wall of the concave portion 6 formed by anisotropic wet etching is, for example, the {xyz} plane, the {xyz} plane is likely to be cleaved with the stress concentration portion 20 as a base point. Therefore, when the plane orientation of the cleavage plane 22 is the {xyz} plane, it is possible to prevent a crack from reaching the n-type drift region 1 even when the crack occurs in the substrate with the stress concentration portion 20 as a base point.

For example, when a plurality of planes, such as the {111} plane and the {xyz} plane, are likely to be cleft, the $p^+$-type isolation layer 11 may be provided so as to include the cleavage plane close to the operation region of the element among the plurality of cleavage planes. In this case, the $p^+$-type isolation layer 11 can be provided so as to include the entire cleavage plane. The structures other than the above are the same as those of the first embodiment. The design margin $w_{12}$ may be determined by the same method as that in the second embodiment.

As described above, according to the third embodiment, it is possible to obtain the same effect as that of the first and second embodiments.

Figure 5:
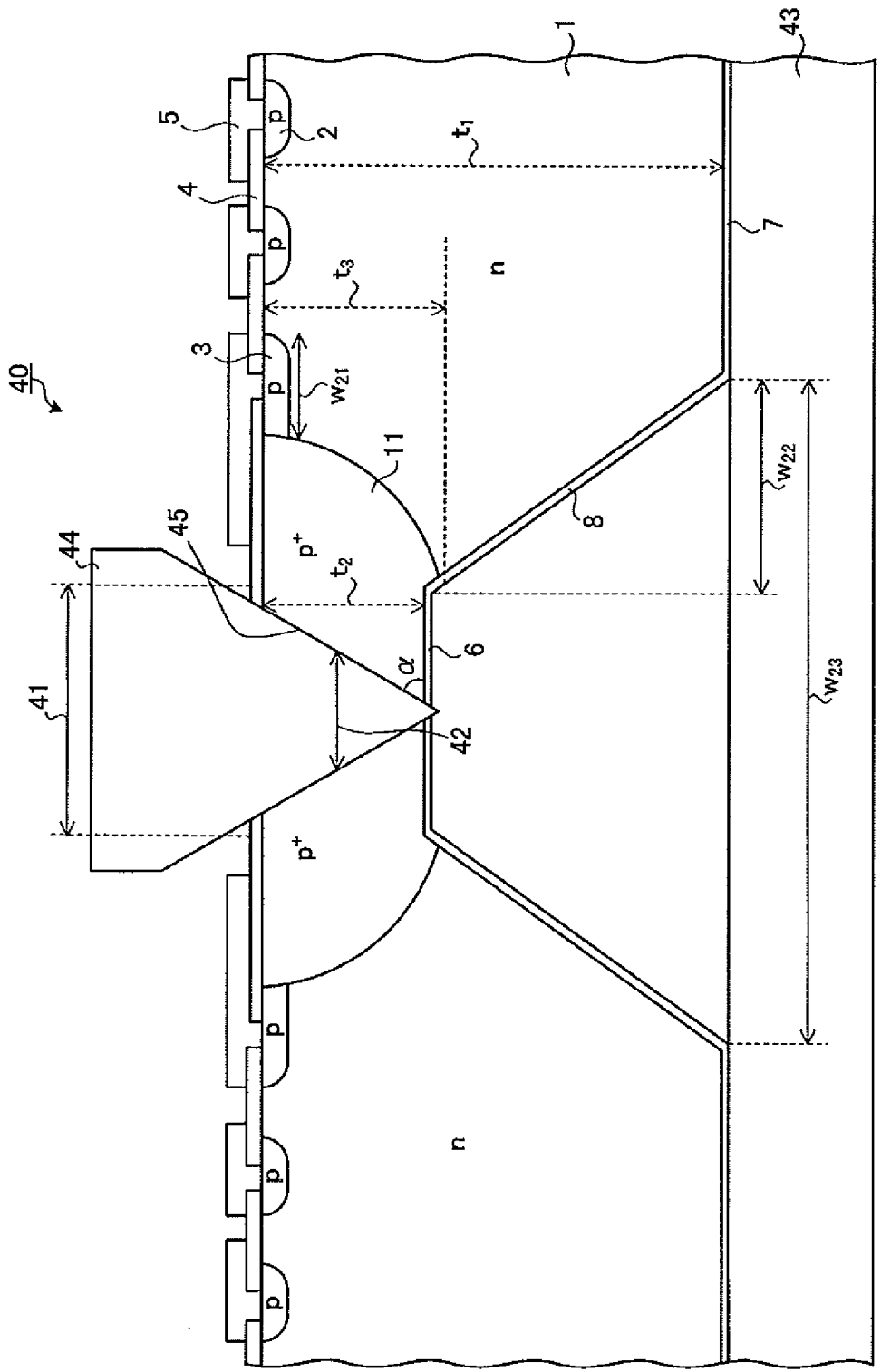
FIG. 5 is a cross-sectional view illustrating a main portion of dicing according to a fourth embodiment.

FIG. 5 is a cross-sectional view illustrating a main portion of dicing according to a fourth embodiment. FIG. 5 shows a portion of a dicing line 41 of a wafer 40 (which is the same as that in FIGS. 6 and 7). A method of dicing the wafer 40 on which a plurality of reverse blocking IGBTs (see FIG. 1) according to the first embodiment is formed will be described below. As shown in FIG. 5, first, for example, boron (B) is introduced into the front surface (first main surface) of the n-type wafer 40, which will be the n-type drift region 1, and is then thermally diffused to form the $p^+$-type isolation layer 11 (first semiconductor region process). Similar to the first embodiment, the $p^+$-type isolation layer 11 may be formed so as to include a cleavage plane having the boundary between the bottom and side wall of the concave portion 6, which will be formed in the subsequent process, as one side. The thickness $t_1$ of the n-type drift region 1 may be, for example, 185 μm. The diffusion depth of the $p^+$-type isolation layer 11 may be, for example, 75 μm.

Then, a front surface element structure is formed on the front surface of the wafer 40 (front surface element structure process). Similar to the first embodiment, for example, a MOS gate structure or a reverse voltage blocking structure may be formed as the front surface element structure. In this case, the width $w_{21}$ of the channel stopper 3 may be equal to or more than 15 μm and equal to or less than 35 μm. Then, the concave portion 6 extending from the backside surface (second main surface) of the wafer 40 to the $p^+$-type isolation layer 11 is formed by, for example, photolithography (concave portion forming process). After the concave portion 6 is formed, the thickness $t_2$ of a portion of the wafer (canopy portion) close to the end of the element may be, for example, 65 μm. In addition, the plane orientation of the side wall of the concave portion 6 may be, for example, the {111} plane. The width $w_{22}$ of the side wall of the concave portion 6 in a direction parallel to the front surface of the wafer may be, for example, 85 μm. The width $w_{23}$ of an opening of the concave portion 6 may be, for example, 270 μm.

Similar to the third embodiment, the concave portion 6 may be formed by, for example, anisotropic wet etching. In this case, the concave portion 6 is formed such that the width of the opening is greater than that of the bottom. The concave portion 6 may be formed by dry etching. In this case, the angle between the side wall of the concave portion 6 and the front surface of the wafer is formed approximately 90°. In the concave portion forming process, although not shown in the drawings, for example, the front surface of the wafer 40 having the front surface element structure formed thereon may be covered by a protective film and then the concave portion 6 may be formed.

Then, a p-type collector region 7 (second semiconductor region) is formed on the backside surface of the wafer 40 (second semiconductor region process). In this case, a p-type region 8 is formed on the bottom and side wall of the concave portion 6 at the same time as the p-type collector region 7 is formed and the p-type collector region 7 and the $p^+$-type isolation layer 11 are electrically connected to each other. In this way, the reverse blocking IGBTs (see FIG. 1) are formed in the region of the wafer 40 which will be divided into chips by dicing.

The dicing line 41 is provided between the reverse blocking IGBTs on the wafer 40. The dicing line 41 is provided on a $p^+$-type isolation layer 11 provided at the end of the reverse blocking IGBT and the concave portion 6. A portion (cutting allowance) 42 that is removed by dicing is included in the dicing line 41 of the wafer 40. The width of the dicing line 41 may be, for example, 100 μm.

Then, a dicing tape 43 is adhered to the backside surface of the wafer 40 on which, for example, the p-type collector region 7 is formed, and the entire wafer 40 is adhered to, for example, a ring frame for dicing. Then, the wafer 40 is placed on, for example, a flat table. Then, a dicing blade (blade) 44 is moved down to the front surface of the wafer 40. A portion of the $p^+$-type isolation layer 11 is removed by the dicing blade 44 such that a cut plane 45 which is inclined at a desired angle with respect to the front surface of the wafer 40 is exposed, and the wafer 40 is cut (cutting process). In this way, the wafer 40 is cut into chips, and the reverse blocking IGBT having the reverse voltage blocking structure shown in FIG. 1 is completed.

In the cutting process, the dicing blade 44 is moved down until the edge of the dicing blade 44 protrudes downward from at least the bottom of the concave portion 6. The edge of the dicing blade 44 may protrude downward from at least the bottom of the concave portion 6. That is, the moving-down of the dicing blade 44 may stop at the time when the edge of the dicing blade 44 protrudes downward from the bottom of the concave portion 6. In addition, a portion of the $p^+$-type isolation layer 11 may be removed such that the cut plane 45 of the $p^+$-type isolation layer 11 becomes the cleavage plane. The other structures of the reverse blocking IGBT may be the same as those of the first to third embodiments.

For example, a thin circular rotary blade having diamond fine particles adhered thereto may be used as the dicing blade 44. The dicing blade 44 has a cross-sectional shape which has a side surface that is parallel to the rotation axis of the dicing blade 44 and is vertical to the front surface of the wafer 40 and in which only an outer circumferential portion, which is a blade edge, is acute. The thickness of the thickest portion (hereinafter, referred to as the actual thickness) of the dicing blade 44 is equal to or more than, for example, the width of the dicing line 41 (see FIG. 5). Therefore, the thickness of an acute portion (blade edge) of the dicing blade 44 is proportional to the actual thickness of the dicing blade 44 and is more than that of the edge of the dicing blade according to the related art (see FIG. 26). The thickness of the edge of the dicing blade 44 is equal to or more than the thickness $t_2$ of a portion of the wafer (canopy portion) close to the end of the element. The edge of the dicing blade 44 has a plane that is inclined substantially at the same angle as the plane exposed as the cut plane 45. When the cleavage plane is exposed as the cut plane 45, the edge of the dicing blade 44 may have a plane that is inclined substantially at the same angle as the cleavage plane.

In the cutting process, it is possible to cut the wafer 40 only by using the dicing blade 44 having the above-mentioned shape such that at least the edge of the dicing blade 44 protrudes from the bottom of the concave portion 6. When the plane of the edge of the dicing blade 44 is inclined substantially at the same angle as a plane exposed from the cut plane 45, it is possible to incline the cut plane 45 of the wafer 40 at a predetermined angle only by making the edge of the dicing blade 44 protrude at least the bottom of the concave portion 6. The angle of the plane exposed from the cut plane 45 may vary depending on the reverse blocking IGBT to be manufactured.

When the plane of the edge of the dicing blade 44 has substantially the same angle as the cleavage plane, it is possible to form the cut plane 45 of the wafer 40 as a cleavage plane having a predetermined inclination angle only by making the edge of the dicing blade 44 protrude at least the bottom of the concave portion 6. When the plane orientation of the cleavage plane exposed from the cut plane 45 is the {111} plane, the angle α between the cut plane 45 and the bottom of the concave portion 6 is 54.7°. The plane orientation of the cleavage plane exposed from the cut plane 45 may vary depending on the plane orientation of the substrate on which the reverse blocking IGBT is formed.

In the first semiconductor region process and the concave portion forming process, the $p^+$-type isolation layer 11 is formed to a predetermined depth and the concave portion 6 is formed so as to reach the $p^+$-type isolation layer 11. In this way, the canopy portion is formed at the end of the element. Therefore, in the next second semiconductor region process, it is possible to form the p-type collector region 7 electrically connected to the $p^+$-type isolation layer 11 through the p-type region 8 that is formed on the bottom and side wall of the concave portion 6. In this way, it is possible to manufacture a reverse blocking IGBT having the same effect as that when the concave portion 6 is not provided and the $p^+$-type isolation layer is provided to a depth equal to the thickness $t_1$ of the n-type drift region 1 so as to reach the p-type collector region 7.

As described above, according to the fourth embodiment, it is possible to obtain the same effect as that of the first embodiment. The end of the chip is cut by dicing to be inclined at a predetermined angle with respect to the front surface of the wafer 40. Therefore, even when external stress is applied to the chip during mounting or operation, it is possible to prevent the stress from being concentrated on the boundary between the bottom and side wall of the concave portion 6. In this way, for example, it is possible to reduce the possibility that a crack will reach the n-type drift region 1 through the interface (pn junction plane) between the $p^+$-type isolation layer 11 and the n-type drift region 1. In addition, it is possible to prevent the canopy portion from being completely cracked into a silicon piece. Therefore, it is possible to reduce the possibility that the canopy portion, which is a silicon piece, will be inserted between a chip and a mounting substrate and stress will be applied to the chip with the silicon piece as a base point. Therefore, it is possible to prevent the electrical characteristics of the reverse blocking IGBT from deteriorating. When the wafer 40 is cut such that the cleavage plane of the wafer 40 is exposed from the cut plane 45, it is possible to easily cut the wafer without applying extra force during dicing. Since the binding force between the atoms is weak in the cleavage plane, the wafer is likely to be cut in the cleavage plane. Therefore, it is possible to prevent stress from being concentrated on a thin portion (canopy portion) of the wafer 40, particularly, the boundary between the bottom and side wall of the concave portion 6 and thus reduce the possibility that a crack will occur in the wafer 40.

Figure 6:
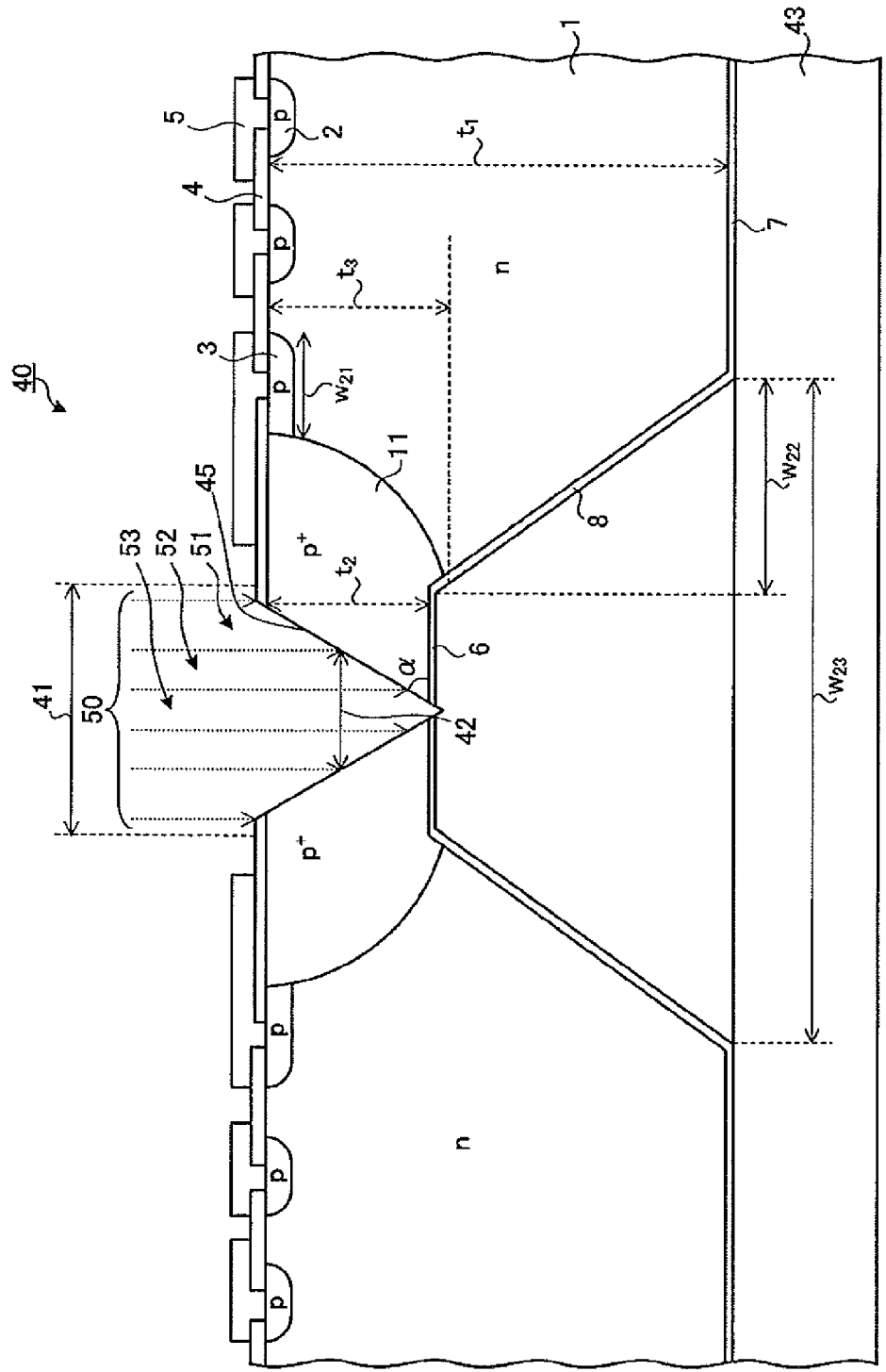
FIG. 6 is a cross-sectional view illustrating a main portion of dicing according to a fifth embodiment.

FIG. 6 is a cross-sectional view illustrating a main portion of dicing according to a fifth embodiment. In the fourth embodiment, instead of using the dicing blade 44, a first laser beam 50 may be emitted to the surface of the wafer 40 to melt and evaporate the wafer 40 from the surface layer of the wafer 40, thereby removing the wafer 40 from the surface layer of the wafer 40.

In the fifth embodiment, in the cutting process, for example, the wafer 40 is cut into chips by a laser abrasion dicing method using the first laser beam 50. The first laser beam 50 is emitted to the surface of the $p^+$-type isolation layer 11 to remove the surface layer of the $p^+$-type isolation layer 11. At that time, as the depth from the surface of the $p^+$-type isolation layer 11 increases, the diameter of the first laser beam 50 decreases gradually. That is, the diameter of the first laser beam 50 along the cut plane 45 to be exposed gradually decreases from the surface of the $p^+$-type isolation layer 11.

For example, in the cutting process of the fifth embodiment, first, the first laser beam 50 with a first beam diameter 51 is emitted to the surface of the $p^+$-type isolation layer 11. Then, the first laser beam 50 with a second beam diameter 52 smaller than the first beam diameter 51 is emitted to the surface of the $p^+$-type isolation layer 11 from which the surface layer has been removed. Then, the first laser beam 50 with a third beam diameter 53 smaller than the second beam diameter 52 is emitted to the surface of the $p^+$-type isolation layer 11 from which the surface layer has been deeply removed. The first to third beam diameters 51 to 53 are determined such that the cut plane 45 formed by the first laser beam 50 has a predetermined inclination angle. In this embodiment, the diameter of the first laser beam 50 is reduced in three stages, but the invention is not limited thereto. The diameter of the first laser beam 50 may be appropriately changed such that the first laser beam 50 is emitted along the cut plane 45 to be exposed. The diameter of the first laser beam 50 may vary depending on the height of the focus of the first laser beam 50 or aberration. The other processes and conditions are the same as those of the fourth embodiment.

As described above, according to the fifth embodiment, it is possible to obtain the same effect as that of the first and fourth embodiments.

Figure 7:
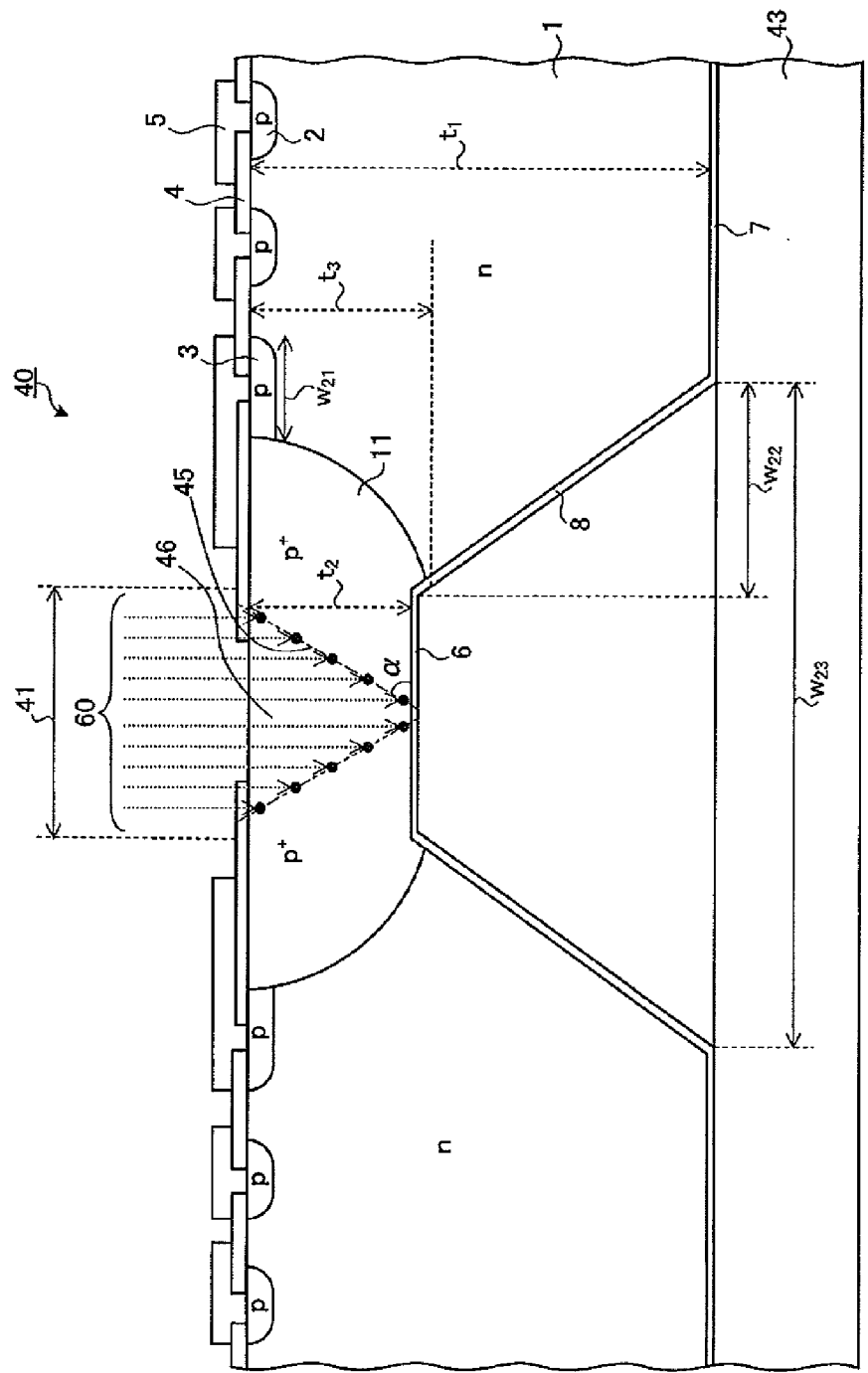
FIG. 7 is a cross-sectional view illustrating a main portion of dicing according to a sixth embodiment.

FIG. 7 is a cross-sectional view illustrating a main portion of dicing according to a sixth embodiment. In the fourth embodiment, instead of using the dicing blade 44, a laser beam 60 may be emitted to the wafer 40 to modify a desired region of the wafer 40, thereby removing a portion of the wafer 40 from the modified region.

In the sixth embodiment, in a cutting process, for example, the wafer 40 is cut into chips by a stealth dicing method using the second laser beam 60. In the cutting process according to the sixth embodiment, first, the second laser beam 60 is emitted to the $p^+$-type isolation layer 11 so as to reach a depth along an exposed plane (which will be a cut plane 45). In this case, the second laser beam 60 is emitted to the $p^+$-type isolation layer 11 such that the emission depth is gradually increased from the end of a cutting allowance 42 of the surface of the $p^+$-type isolation layer 11 toward the center of the cutting allowance 42. In this way, a region of the $p^+$-type isolation layer 11 to which the second laser beam 60 is emitted is modified into a crystal structure that is likely to be cracked by external force. In this case, at the same time as the second laser beam 60 is emitted, for example, a dicing tape 43 adhered to the backside surface of the wafer 40 is drawn to apply external force to the wafer 40. In this way, the p+-type isolation layer 11 is cut into, for example, triangular-prism-shaped silicon pieces 46 along the exposed plane. The silicon pieces 46 are drawn and removed from the surface of the wafer 40, such that the cut plane 45 is exposed. The drawing of the silicon pieces 46 is performed at the same time as the second laser beam 60 is emitted. That is, at the same time as the second laser beam 60 is emitted, external force is applied to cut the wafer 40 into the silicon pieces 46 and the silicon pieces 46 are drawn. The other processes and conditions are the same as those of the fourth embodiment.

In the above-mentioned process, the silicon pieces 46 are cut and drawn at the same time, but the invention is not limited thereto. The emission of the second laser beam 60, the cutting-out of the silicon pieces 46, and the drawing of the silicon pieces 46 may be performed as individual processes.

As described above, according to the sixth embodiment, it is possible to obtain the same effect as that of the first and fourth embodiments.

Figure 8:
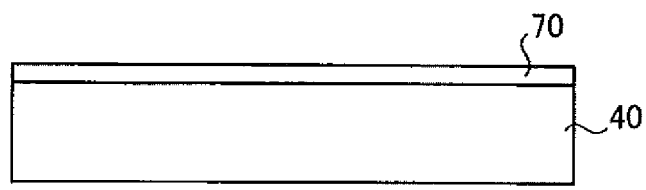
FIG. 8 is a cross-sectional view illustrating a method of forming a mask used to form a concave portion according to a seventh embodiment.
Figure 9:
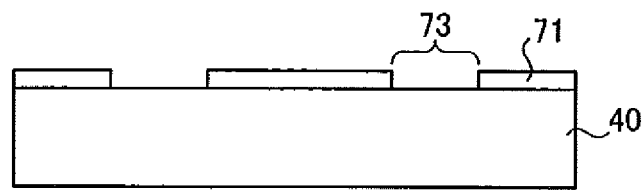
FIG. 9 is a cross-sectional view illustrating the method of forming the mask used to form the concave portion according to the seventh embodiment.

FIGS. 8 and 9 are cross-sectional views illustrating a method of forming a mask used to form a concave portion according to a seventh embodiment. The mask for forming the concave portion is used to form, for example, a concave portion (see FIG. 1) in the reverse blocking IGBT according to the first embodiment. Here, for example, a method of forming a concave portion in the concave portion forming process according to the fourth embodiment will be described. First, as shown in FIG. 8, a resist 70 is coated on the backside surface (second main surface) of the wafer 40. For example, a front surface element structure may be formed on the front surface of the wafer 40 in advance, similar to the fourth embodiment. Then, as shown in FIG. 9, the resist 70 is patterned by exposure and development such that a region in which the concave portion of the wafer 40 will be formed is exposed. In this way, a resist mask 71 having an opening portion 73 through which the region in which the concave portion will be formed is exposed is completed (mask forming process). Then, etching is performed using the resist mask 71 to form a concave portion in the wafer 40. In this case, for example, an alkali etchant may be used to perform anisotropic wet etching. The alkali etchant may include, for example, tetramethylammonium hydroxide (TMAH), ammonium disulfate, and silicon.

Figure 10:
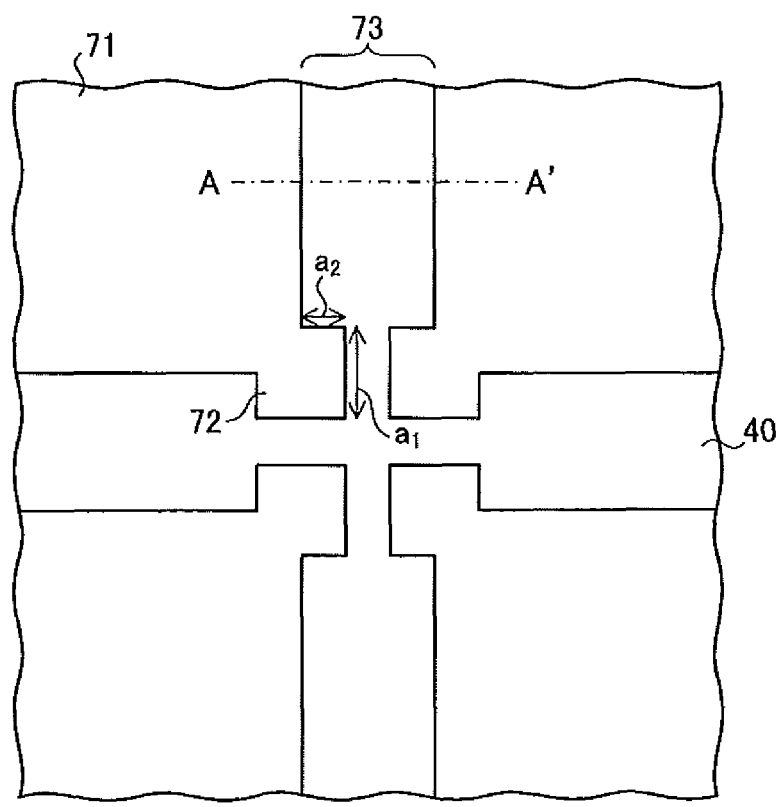
FIG. 10 is a plan view illustrating the pattern shape of the mask used to form the concave portion according to the seventh embodiment.

FIG. 10 is a plan view illustrating the pattern shape of the mask used to form the concave portion according to the seventh embodiment. FIG. 10 shows a portion of the corner of the resist mask 71 formed on the surface of the wafer 40. As shown in FIG. 10, the resist mask 71 has, for example, a planar shape in which opening portions 73 are formed in a lattice and a plurality of rectangular resists is arranged in a matrix in the horizontal and vertical directions. A square-shaped protruding portion (hereinafter, referred to as a compensation pattern) 72 protruding toward the opening portion 73 is provided at the corner (hereinafter, simply referred to as the corner of the resist mask 71) of one rectangular resist of the resist mask 71. That is, the compensation pattern 72 is provided so as to protrude on the region in which the concave portion will be formed. The compensation pattern 72 is provided such that the diagonal line of the compensation pattern 72 is disposed on the extension line of the diagonal line of the resist mask 71. In addition, the compensation pattern 72 is arranged such that one-fourth of the compensation pattern 72 overlaps the corner of the resist mask 71.

A width (hereinafter, referred to as a compensation pattern width) $a_2$ that is half of the width $a_1$ of one side of the compensation pattern 72 is the depth (hereinafter, referred to as a concave portion depth) d of the concave portion and it is preferable that the width $a_2$ satisfy the following Expression 3 in order to prevent the occurrence of a non-etched portion (hereinafter, referred to as an etching residue) in the vicinity of the concave portion (hereinafter, referred to as a concave portion corner end) near the compensation pattern 72 after the concave portion is formed.

$$a_2 = 0.60d \quad \text{[Expression 3]}$$

Figure 11:
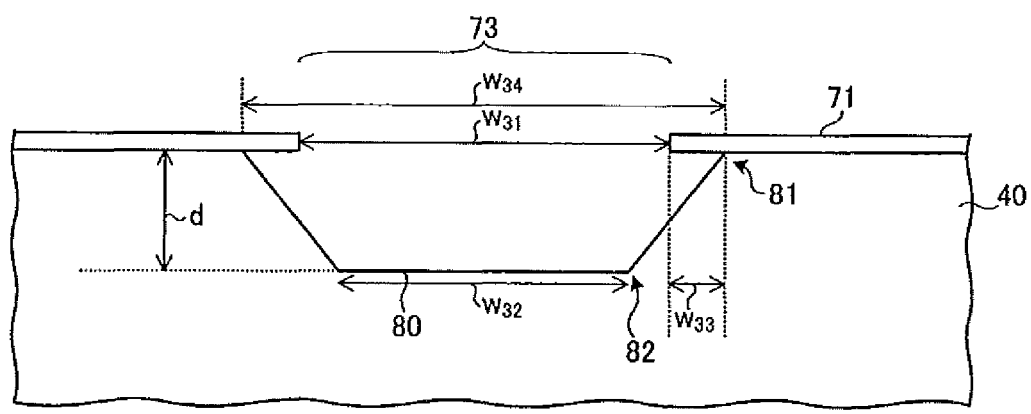
FIG. 11 is a cross-sectional view illustrating the sectional structure taken along the line A-A' of FIG. 10.

Next, the shape of a concave portion when the resist mask 71 is used to form a concave portion 80 in the wafer 40 will be described. FIG. 11 is a cross-sectional view illustrating the section structure taken along the line A-A' of FIG. 10. FIG. 11 shows the shape of the concave portion without the compensation pattern 72. As shown in FIG. 11, a side wall upper end (hereinafter, referred to as a concave portion side wall upper end) 81 of the concave portion 80 is a width $w_{33}$ inward from the end of the opening portion of the resist mask 71 to a region below the resist mask 71. This is because etching (side etching) is performed below the resist mask 71 in the horizontal direction using the resist mask 71. Therefore, the width (hereinafter, referred to as a concave portion opening width) $w_{34}$ of an opening portion of the concave portion 80 is greater than the width (hereinafter, referred to as a mask opening width) $w_{31}$ of the opening portion 73 of the resist mask 71.

A side wall lower end (hereinafter, referred to as a concave portion side wall lower end) 82 of the concave portion 80 is closer to the center of the concave portion 80 than the concave portion side wall upper end 81. This is because a surface that is likely to appear by etching is exposed from the side wall of the concave portion 80, as described in the third embodiment. Therefore, the width (hereinafter, referred to as a concave portion bottom width) $w_{32}$ of the bottom of the concave portion 80 is smaller than the concave portion opening width $w_{34}$. When the depth (concave portion depth) d of the concave portion 80 is, for example, 85 μm and the mask opening width $w_{31}$ is 240 μm, the width $w_{33}$ from the end of the opening portion of the resist mask 71 to the concave portion side wall upper end 81 is, for example, about 45 μm. That is, the concave portion opening width $w_{34}$ is about 330 μm. In addition, the concave portion bottom width $w_{32}$ is about 190 μm.

Figure 12:
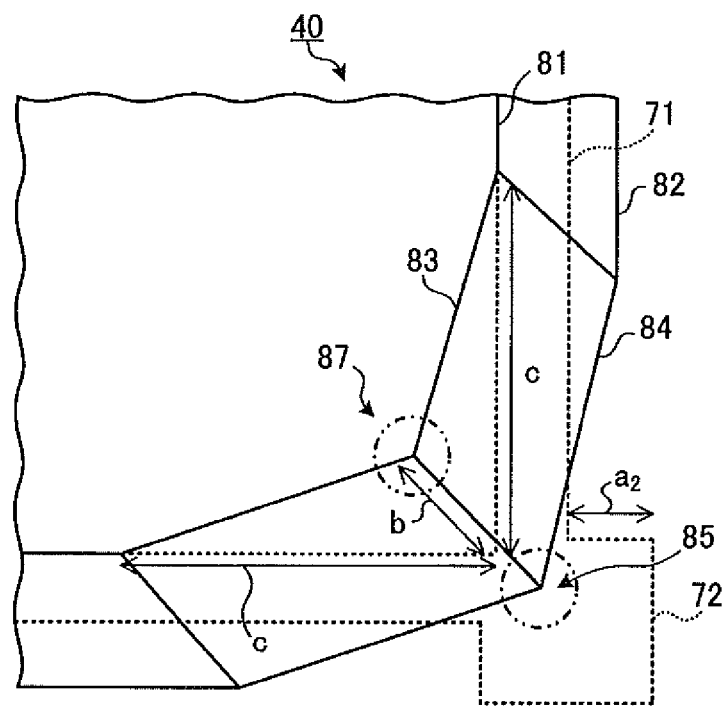
FIG. 12 is a bird's eye view illustrating the shape of a concave portion in the vicinity of a compensation pattern after the concave portion is formed.

FIG. 12 is a bird's eye view illustrating a concave portion in the vicinity of the compensation pattern after the concave portion is formed. FIG. 12 shows the shape of the concave portion (hereinafter, referred to as a concave portion corner) in the vicinity of the compensation pattern 72. A concave portion corner upper end 87 is a width (hereinafter, referred to as a first etching width) b inward from an intersection point with the extension line of the concave portion side wall upper end 81 to the resist mask 71 in the diagonal direction of the resist mask 71. In addition, when the concave portion corner upper end 87 is etched to the first etching width b, a side wall upper end 83 of the corner of the concave portion is etched to a width (hereinafter, referred to as a second etching width) c from the intersection point with the extension line of the concave portion side wall upper end 81 along the side wall of the concave portion corner and is disposed inside the resist mask 71. The reason is the same as that for the concave portion side wall upper end 81.

A concave portion corner lower end 85 is disposed closer to the center of the concave portion 80 than the concave portion corner upper end 87. In addition, the side wall lower end 84 of the corner of the concave portion is disposed closer to the center of the concave portion 80 than the side wall upper end 83 of the corner of the concave portion. The reason is the same as that for the concave portion side wall lower end 82.

As described above, according to the seventh embodiment, the compensation pattern 72 is provided at the corner of the resist mask 71 under the above-mentioned conditions. When the end of the corner of the concave portion that is most likely to be etched is masked with the compensation pattern 72, it is possible to make the amount of etching of the concave portion corner end substantially equal to the amount of etching of the side wall of the corner of the concave portion. In this way, it is possible to prevent, for example, a pit (undercut) from being formed at the concave portion corner end. The resist mask 71 is formed by a resist. Therefore, it is possible to easily perform side etching below the mask, as compared to etching using the oxide film mask according to the related art. In this way, even when an undercut occurs at the concave portion corner, side etching is performed above the undercut and thus it is possible to prevent an uneven portion from being formed on the side wall of the concave portion. Therefore, for example, it is possible to effectively form a p-type region on the side wall of the concave portion of the reverse blocking IGBT and electrically connect the $p^+$-type isolation layer and the p-type collector region (for example, see FIG. 1). In this way, it is possible to maintain the reverse blocking capability of the reverse blocking IGBT and prevent the electrical characteristics of the reverse blocking IGBT from deteriorating.

Figure 13:
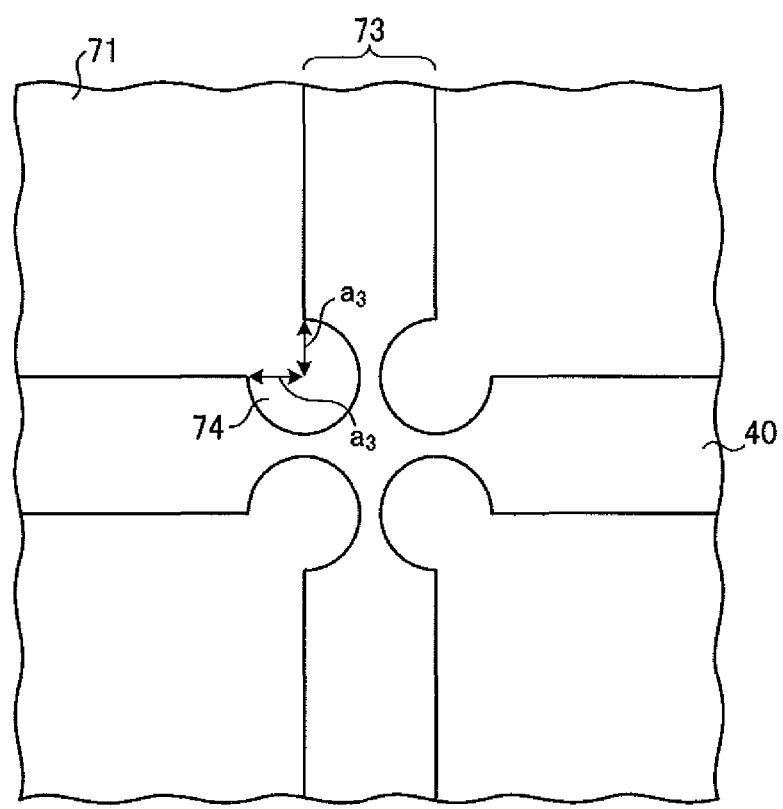
FIG. 13 is a plan view illustrating the pattern shape of a mask used to form a concave portion according to an eighth embodiment.
Figure 14:
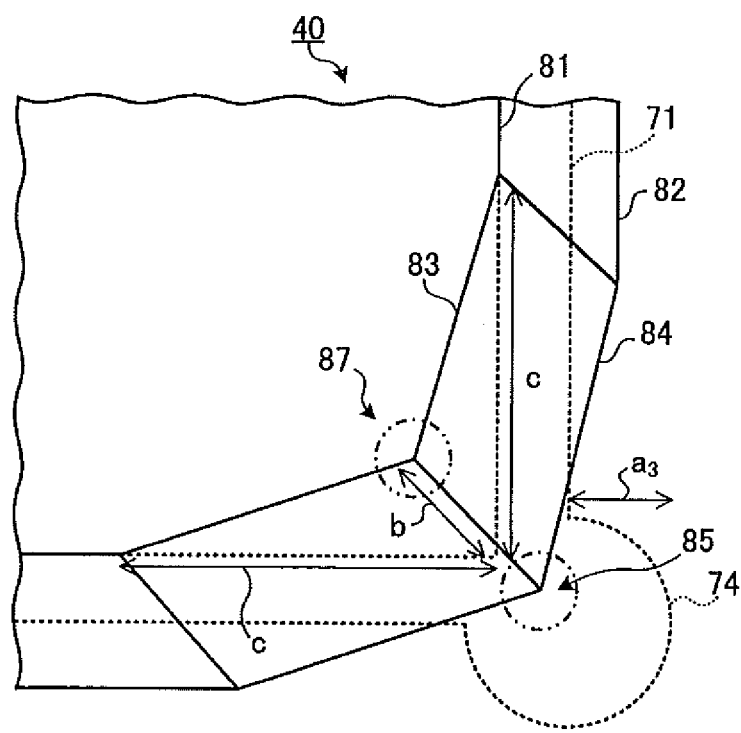
FIG. 14 is a bird's eye view illustrating the shape of a concave portion in the vicinity of a compensation pattern after the concave portion is formed.

FIG. 13 is a plan view illustrating the pattern shape of a mask used to form a concave portion according to an eighth embodiment. FIG. 14 is a bird's eye view illustrating a concave portion in the vicinity of a compensation pattern after the concave portion is formed. In FIG. 14, a concave portion (only the side wall is shown) is formed in the wafer 40 using a resist mask 71 having a compensation pattern 74. In the seventh embodiment, the compensation pattern 74 may have a circular shape.

In the eighth embodiment, the compensation pattern 74 having a circular shape is provided at the corner of the resist mask 71. The compensation pattern 74 is provided such that a quarter of the arc of the compensation pattern 74 including the center of the circle overlaps the corner of the resist mask 71. In the compensation pattern 74, the radius $a_3$ of the compensation pattern 74 is a compensation pattern width. It is preferable that the compensation pattern width $a_3$ satisfy the following Expression 4 where the depth of the concave portion is d. The reason is the same as that in the seventh embodiment. The other structures are the same as those in the seventh embodiment.

$$a_3=0.81d \qquad \text{[Expression 4]}$$

As described above, according to the eighth embodiment, it is possible to obtain the same effect as that of the seventh embodiment.

Example 1

Figure 15:
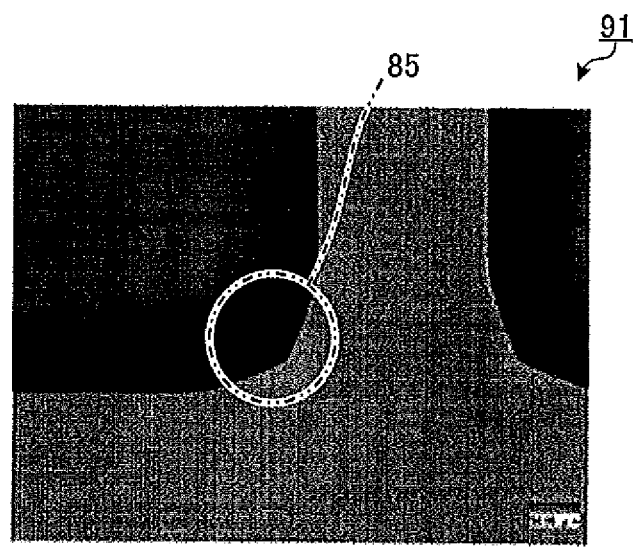
FIG. 15 is a diagram illustrating the shape of the corner of a concave portion observed by the electron microscope from the surface direction.
Figure 16:
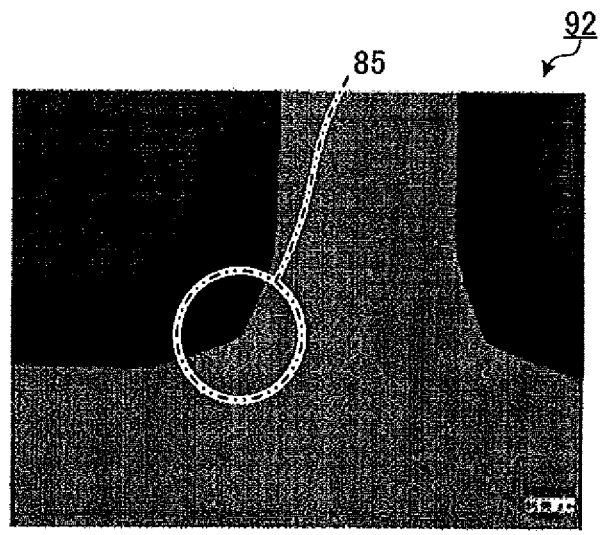
FIG. 16 is a diagram illustrating the shape of the corner of a concave portion observed by the electron microscope from the surface direction.

FIGS. 15 to 18 are electron micrographs showing the shape of the corner of a concave portion observed from the surface direction. First, a sample having a concave portion formed therein was manufactured according to the seventh embodiment (hereinafter, referred to as a first example 91: FIG. 15). In the first example 91, the compensation pattern width was 50 μm satisfying Expression 3. In addition, a sample having a concave portion formed therein was manufactured according to the eighth embodiment (hereinafter, referred to as a second example 92: FIG. 16). In the first example 92, the compensation pattern width was 70 μm satisfying Expression 4.

Figure 17:
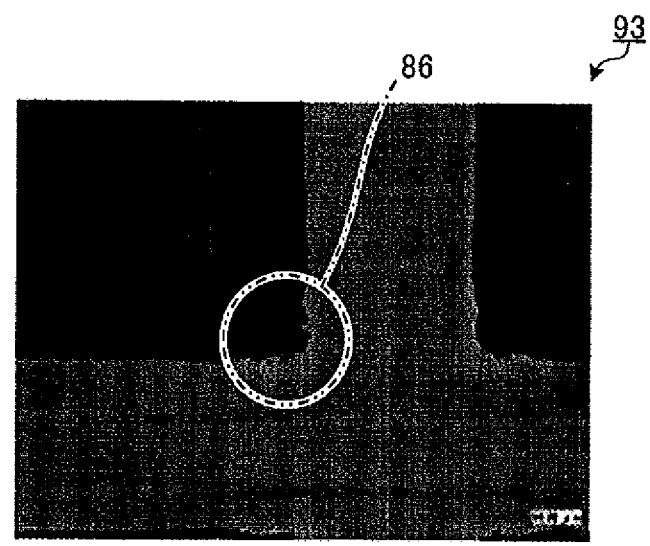
FIG. 17 is a diagram illustrating the shape of the corner of a concave portion observed by the electron microscope from the surface direction.
Figure 18:
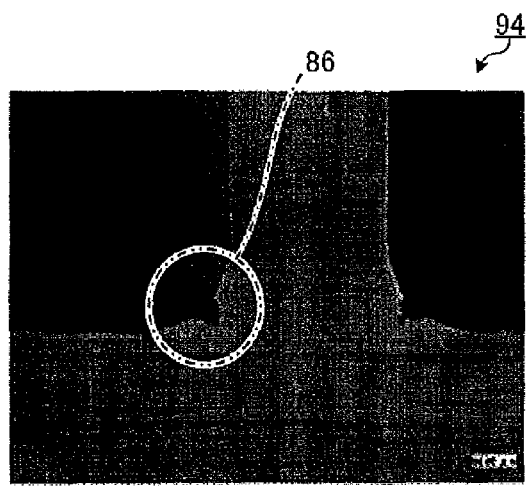
FIG. 18 is a diagram illustrating the shape of the corner of a concave portion observed by the electron microscope from the surface direction.

As a comparative example, a sample having a concave portion formed therein was manufactured under the conditions that did not satisfy Expression 3 (hereinafter, referred to as a first comparative example 93: FIG. 17). In the first comparative example 93, the compensation pattern width was 60 μm. The other structures were the same as those of the first example 91. In addition, a sample having a concave portion formed therein was manufactured under the conditions that did not satisfy Expression 4 (hereinafter, referred to as a second comparative example 94: FIG. 18). In the second comparative example 94, the compensation pattern width was 80 μm. The other structures were the same as those of the second example 92. Then, it was checked that there was an etching residue at the concave portion corner lower end.

The results shown in FIGS. 15 and 16 proved that there was an etching residue at the concave portion corner lower end 85 in the first example 91 and the second example 92. The results shown in FIGS. 17 and 18 proved that there was an etching residue at the concave portion corner lower end 86 in the first comparative example 93 and the second comparative example 94. It was proved that, when the compensation pattern was provided with the compensation pattern width satisfying Expression 3 or Expression 4, it was possible to prevent the generation of an etching residue at the concave portion corner lower end.

Example 2

Figure 19:
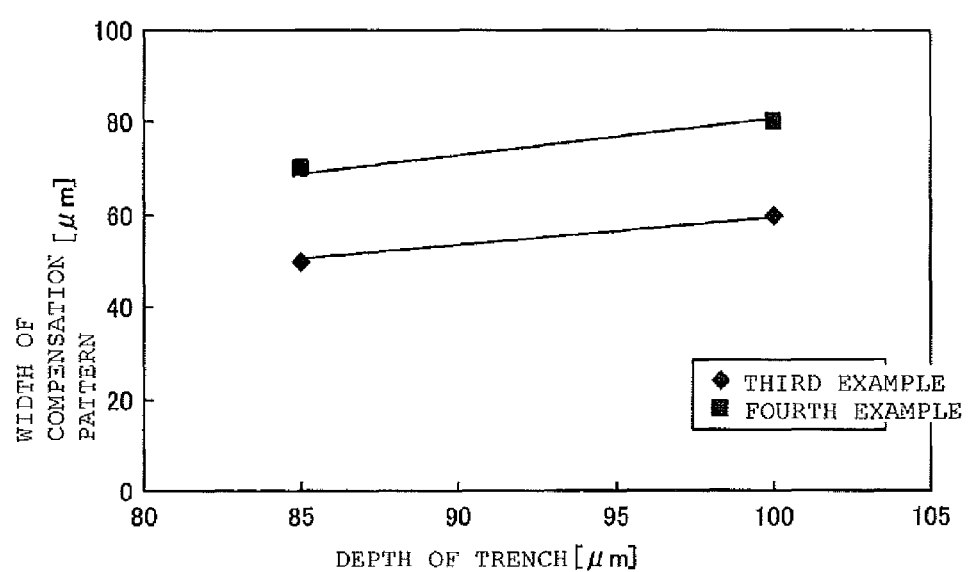
FIG. 19 is a characteristic diagram illustrating the relationship between the width of the compensation pattern and the depth of the concave portion.

FIG. 19 is a characteristic diagram illustrating the relationship between the compensation pattern width and the concave portion depth. A plurality of samples, each having a concave portion formed therein, was manufactured according to the seventh embodiment while changing the compensation pattern width and the concave portion depth in various ways (hereinafter, referred to as a third example). In addition, a plurality of samples, each having a concave portion formed therein, was manufactured according to the eighth embodiment while changing the compensation pattern width and the concave portion depth in various ways (hereinafter, referred to as a fourth example). Then, the conditions in which no etching residue was generated at the concave portion corner lower end were examined.

The result shown in FIG. 19 proved that, when the compensation pattern width was "a" and the concave portion depth was "d", the sample in which no etching residue was generated satisfied a=0.5951d in the third example. That is, in the seventh embodiment, when the compensation pattern width and the concave portion depth were determined so as to satisfy Expression 3, it was possible to prevent an etching residue from being generated at the concave portion corner lower end.

The fourth example proved that, when the compensation pattern width was "a" and the concave portion depth was "d," the sample in which no etching residue was generated satisfied a=0.5951d. That is, in the eighth embodiment, when the compensation pattern width and the concave portion depth were determined so as to satisfy Expression 4, it was possible to prevent an etching residue from being generated at the concave portion corner lower end.

Example 3

Figure 20:
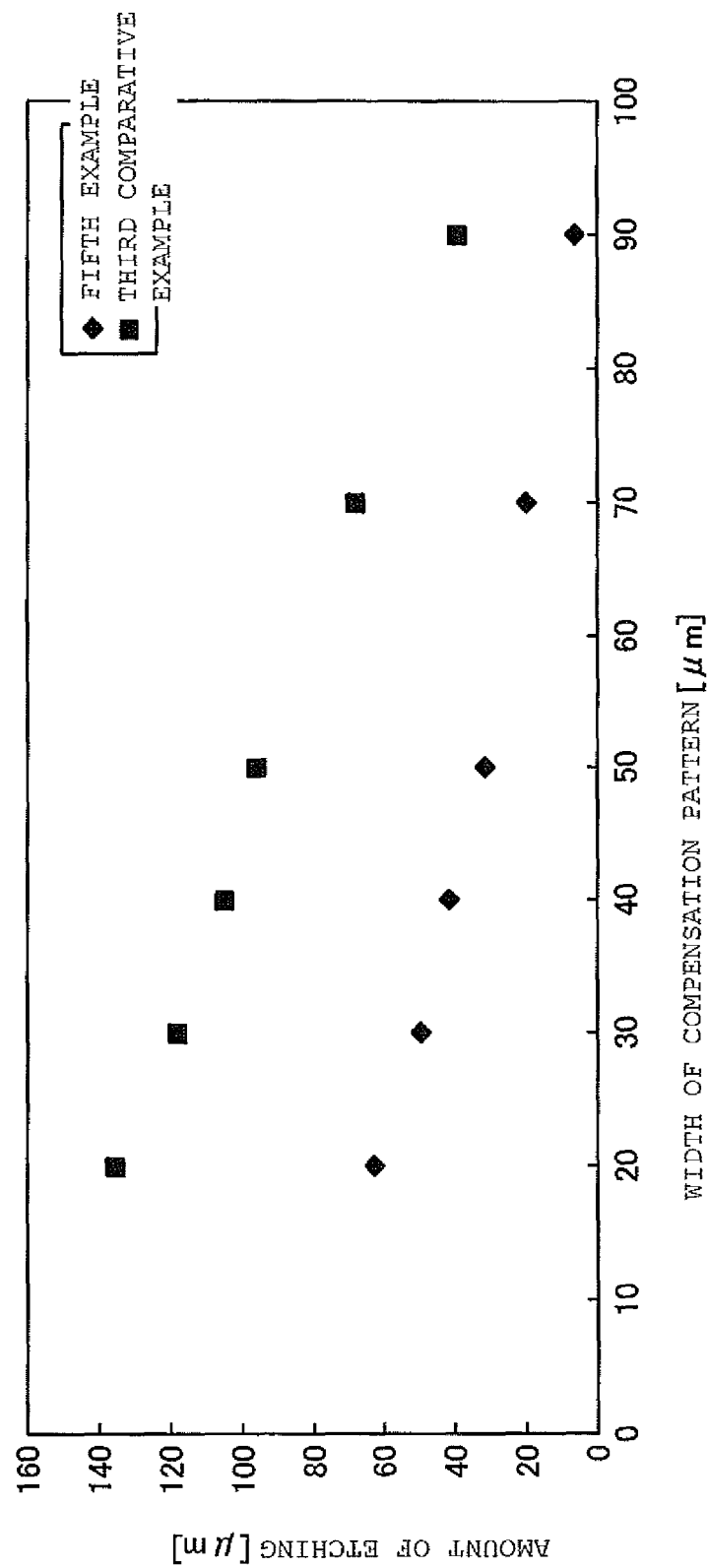
FIG. 20 is a characteristic diagram illustrating the relationship between the width of the compensation pattern and the amount of etching.
Figure 21:
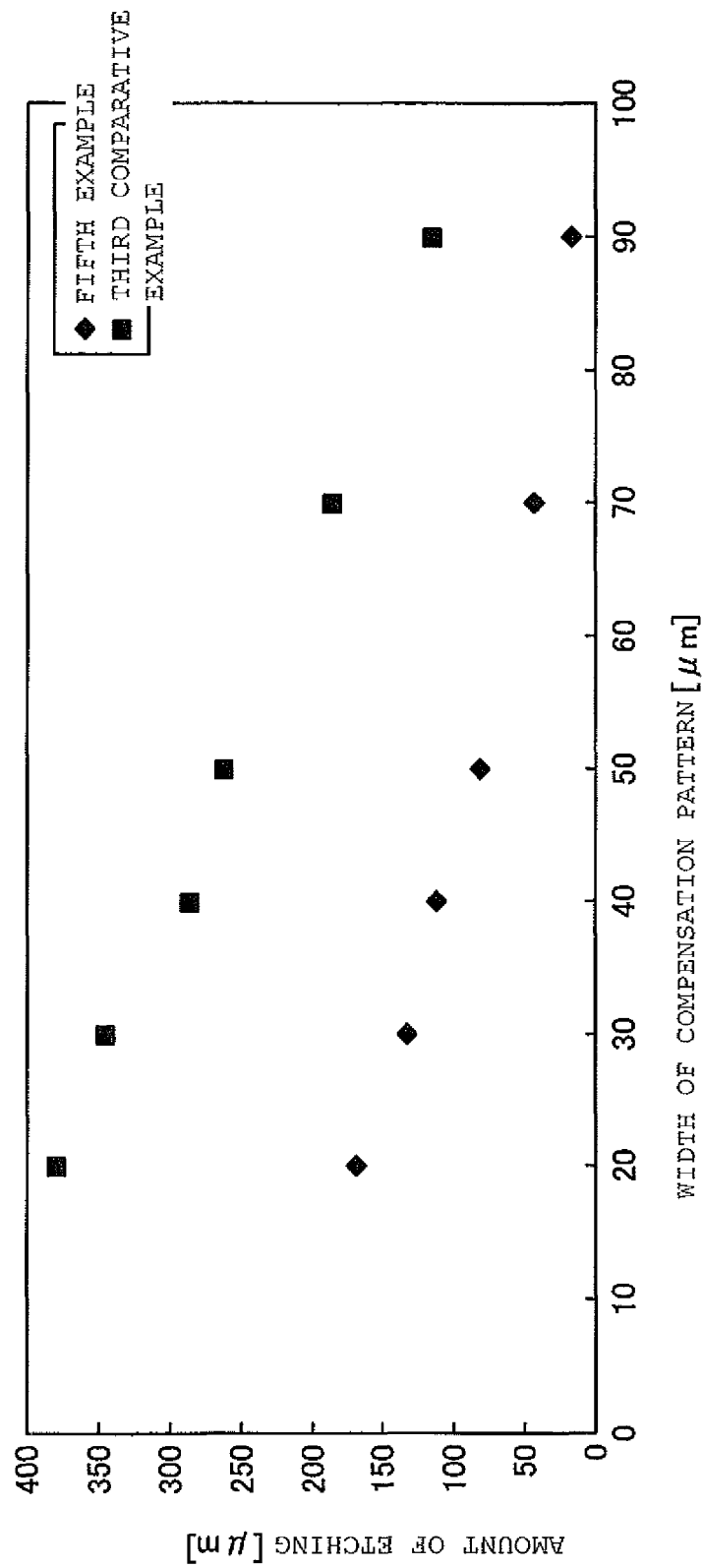
FIG. 21 is a characteristic diagram illustrating the relationship between the width of the compensation pattern and the amount of etching.
Figure 22:
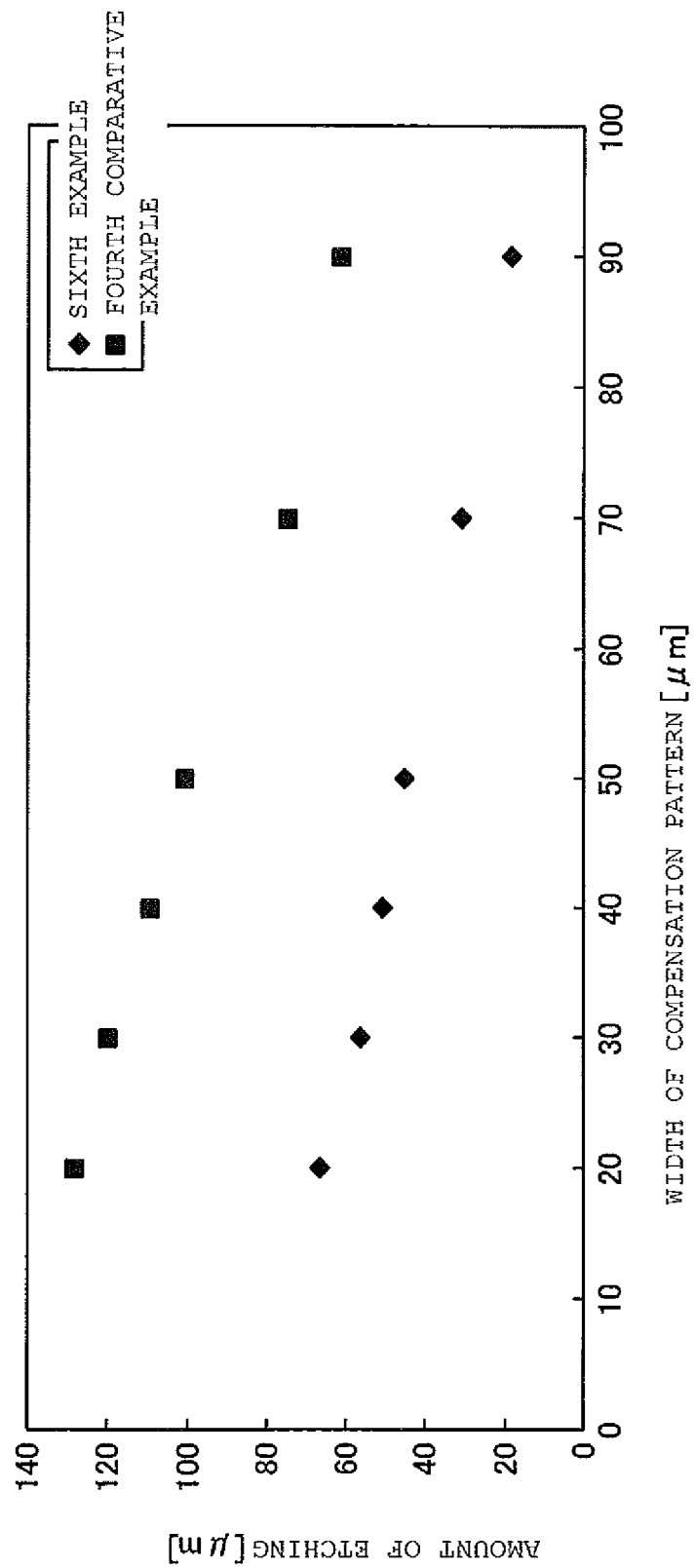
FIG. 22 is a characteristic diagram illustrating the relationship between the width of the compensation pattern and the amount of etching.
Figure 23:
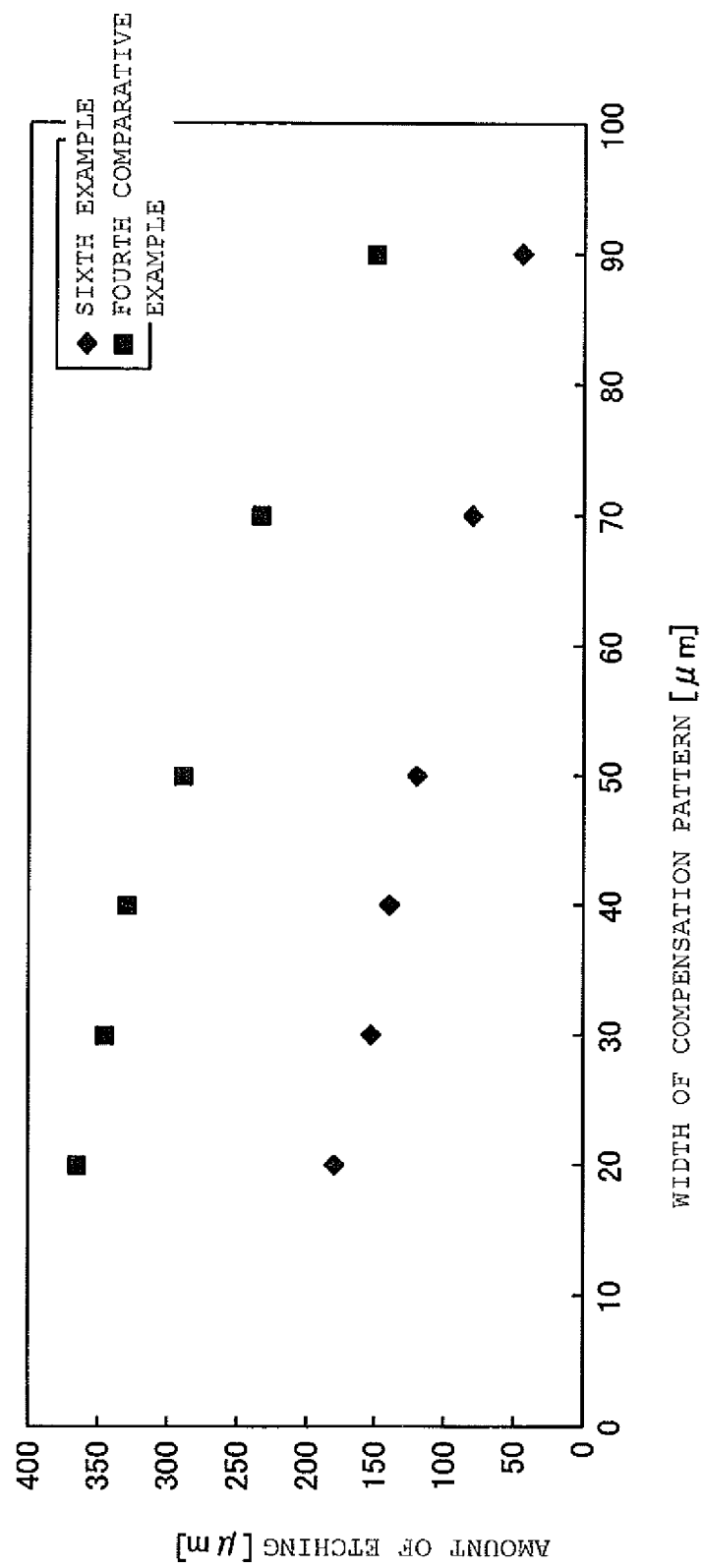
FIG. 23 is a characteristic diagram illustrating the relationship between the width of the compensation pattern and the amount of etching.

FIGS. 20 to 23 are characteristic diagrams illustrating the relationship between the compensation pattern width and the amount of etching. In FIGS. 20 and 22, the amount of etching indicates the first etching width. In FIGS. 21 and 23, the amount of etching indicates the second etching width. First, a sample in which a concave portion was formed using a resist mask having a square-shaped compensation pattern was manufactured according to the seventh embodiment (hereinafter, referred to as a fifth example). As a comparative example, a sample in which a concave portion was formed using an oxide film resist mask having a square-shaped compensation pattern was manufactured (hereinafter, referred to as a third comparative example). The other conditions of the third comparative example were the same as those of the fifth example.

A plurality of samples, each having a concave portion formed using a resist mask having a circular compensation pattern, was manufactured according to the eighth embodiment (hereinafter, referred to as a sixth example). As a comparative example, a plurality of samples, each having a concave portion formed using an oxide film mask having a circular compensation pattern, was manufactured (hereinafter, referred to as a fourth comparative example). The other conditions of the fourth comparative example were the same as those of the sixth example. The plurality of samples was manufactured while changing the compensation pattern width, the first etching width, and the second etching width in various ways.

The results shown in FIGS. 20 and 21 proved that, in the fifth example formed using the resist mask, the amount of etching was more than that in the third comparative example formed using the oxide film mask. The results shown in FIGS. 22 and 23 proved that, in the sixth example formed using the resist mask, the amount of etching was more than that in the fourth comparative example formed using the oxide film mask. In this way, in etching using the resist mask, it was easy to perform side etching on the concave portion corner upper end, as compared to etching using the oxide film mask.

In the above-described embodiments of the invention, the p$^+$-type isolation layer 11 is provided so as to include the cleavage plane 21, but the invention is not limited thereto. The p$^+$-type isolation layer 11 may be provided so as to include a plane in which a crack is likely to occur. The plane in which a crack is likely to occur may be a plane having the stress concentration portion 20 as one side or a plane including other portions on which stress is likely to be concentrated.

As described above, the semiconductor device and the method of manufacturing the semiconductor device according to the embodiments of the invention can be applied to power semiconductor devices used in, for example, power supply apparatuses, such as power conversion apparatuses or various kinds of industrial machines.

What is claimed is:

1. A semiconductor device comprising:
    a substrate of a first conduction type, the substrate having a first main surface, a second main surface and a concave portion formed on the second main surface;
    a front surface element structure provided on the first main surface of the substrate;
    a first semiconductor region of a second conduction type formed at a side end of the front surface element structure, the concave portion extending from the second main surface of the substrate to the first semiconductor region; and
    a second semiconductor region of the second conduction type disposed on the second main surface of the substrate and being electrically connected to the first semiconductor region, wherein
    the first semiconductor region includes a cleavage plane, an entire portion of the cleavage plane between a boundary, which is an intersection of a bottom wall of the concave portion and a side wall of the concave portion, and an intersection of the cleavage plane and the first main surface of the substrate, being in the first semiconductor region.

2. The semiconductor device according to claim 1, wherein
    the substrate further includes a third semiconductor region of the first conduction type, and the first semiconductor region is adjacent to the third semiconductor region, and
    an amount of impurities included in a portion of the first semiconductor region between the cleavage plane and the side end of the front surface element structure is set such that a depletion layer extending from the third semiconductor region into the first semiconductor region does not reach the cleavage plane.

3. The semiconductor device according to claim 2, wherein the amount of impurities is equal to or more than $1.2 \times 10^{12}/\text{cm}^2$.

4. The semiconductor device according to claim 1, wherein an amount of impurities included in a portion of the first semiconductor region between the cleavage plane and the side end of the front surface element structure is equal to or more than $1.2 \times 10^{12}/\text{cm}^2$.

5. The semiconductor device according to claim 1, wherein a side of each cleavage plane is formed at the boundary.

6. The semiconductor device of claim 1, wherein a first distance, between the side end of the front surface element structure and the intersection of the cleavage plane and the first main surface, is longer than a second distance between the side end and the boundary in a direction parallel to the first main surface.

* * * * *